US010777587B2

(12) United States Patent
Nishimura et al.

(10) Patent No.: US 10,777,587 B2
(45) Date of Patent: Sep. 15, 2020

(54) ACTIVE MATRIX SUBSTRATE AND DISPLAY DEVICE PROVIDED WITH ACTIVE MATRIX SUBSTRATE

(71) Applicant: Sharp Kabushiki Kaisha, Sakai, Osaka (JP)

(72) Inventors: Jun Nishimura, Sakai (JP); Yoshihito Hara, Sakai (JP); Yoshimasa Chikama, Sakai (JP); Yukinobu Nakata, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/329,784

(22) PCT Filed: Aug. 31, 2017

(86) PCT No.: PCT/JP2017/031356
§ 371 (c)(1),
(2) Date: Mar. 1, 2019

(87) PCT Pub. No.: WO2018/043643
PCT Pub. Date: Mar. 8, 2018

(65) Prior Publication Data
US 2019/0221590 A1     Jul. 18, 2019

(30) Foreign Application Priority Data

Sep. 2, 2016   (JP) .................................. 2016-171552

(51) Int. Cl.
*H01L 27/12*   (2006.01)
*H01L 29/786*  (2006.01)
(Continued)

(52) U.S. Cl.
CPC ........ *H01L 27/1251* (2013.01); *G02F 1/1345* (2013.01); *G02F 1/1368* (2013.01);
(Continued)

(58) Field of Classification Search
None
See application file for complete search history.

(56) References Cited

U.S. PATENT DOCUMENTS

2004/0046920 A1   3/2004   Hayata et al.
2008/0024416 A1   1/2008   Onogi et al.
(Continued)

FOREIGN PATENT DOCUMENTS

JP   2004-101863 A   4/2004
JP   2006-119404 A   5/2006
(Continued)

OTHER PUBLICATIONS

Official Communication issued in International Patent Application No. PCT/JP2017/031356, dated Nov. 21, 2017.

*Primary Examiner* — Mounir S Amer
(74) *Attorney, Agent, or Firm* — Keating & Bennett, LLP

(57) ABSTRACT

Provided is an active matrix substrate (1001) that includes multiple inspection TFTs (10Q) that are arranged in a non-display area (900), and an inspection circuit (200) that includes multiple inspection TFTs (10Q). At least one or more of the multiple inspection TFTs (10Q) are arranged within a semiconductor chip mounting area (R) in which a semiconductor chip is mounted. Each of the multiple inspection TFTs (10Q) includes a semiconductor layer, a lower gate electrode (FG) that is positioned on a side of the substrate of the semiconductor layer with a gate insulation layer in between, an upper gate electrode (BG) that is positioned on a side opposite to the side of the substrate of the semiconductor layer with an insulation layer including a first insulation layer in between, and a source electrode and a drain electrode that are connected to the semiconductor layer.

20 Claims, 12 Drawing Sheets

(51) Int. Cl.
*G02F 1/1362* (2006.01)
*G02F 1/1368* (2006.01)
*G02F 1/1345* (2006.01)

(52) U.S. Cl.
CPC ...... *G02F 1/136286* (2013.01); *H01L 27/124* (2013.01); *H01L 27/1225* (2013.01); *H01L 29/7869* (2013.01); *H01L 29/78648* (2013.01); *H01L 29/78675* (2013.01); *G02F 2001/136254* (2013.01)

(56) References Cited

U.S. PATENT DOCUMENTS

| | | |
|---|---|---|
| 2008/0117345 A1 | 5/2008 | Ishii et al. |
| 2008/0225024 A1 | 9/2008 | Ito |
| 2009/0323005 A1 | 12/2009 | Ota |
| 2010/0134740 A1 | 6/2010 | Nakao |
| 2011/0193846 A1 | 8/2011 | Kimura et al. |
| 2012/0138922 A1 | 6/2012 | Yamazaki et al. |
| 2013/0320334 A1 | 12/2013 | Yamazaki et al. |
| 2014/0117347 A1* | 5/2014 | Chiang ............... H01L 29/7869 257/43 |
| 2014/0139775 A1 | 5/2014 | Miyake et al. |
| 2014/0217412 A1 | 8/2014 | Yanagisawa et al. |
| 2014/0286076 A1 | 9/2014 | Aoki et al. |
| 2015/0108467 A1 | 4/2015 | Moriguchi et al. |
| 2015/0187860 A1* | 7/2015 | Seo ................ H01L 27/3276 257/40 |
| 2017/0345940 A1 | 11/2017 | Suzuki et al. |

FOREIGN PATENT DOCUMENTS

| | | |
|---|---|---|
| JP | 2008-032899 A | 2/2008 |
| JP | 2008-129374 A | 6/2008 |
| JP | 2008-225036 A | 9/2008 |
| JP | 2010-8758 A | 1/2010 |
| JP | 2010-128418 A | 6/2010 |
| JP | 2011-154161 A | 8/2011 |
| JP | 2011-186450 A | 9/2011 |
| JP | 2012-134475 A | 7/2012 |
| JP | 2014-7399 A | 1/2014 |
| JP | 2014-103142 A | 6/2014 |
| JP | 2014-153493 A | 8/2014 |
| JP | 2014-209727 A | 11/2014 |
| WO | 2012/086513 A1 | 6/2012 |
| WO | 2016/084699 A1 | 6/2016 |

* cited by examiner

ACTIVE MATRIX SUBSTRATE AND DISPLAY DEVICE PROVIDED WITH ACTIVE MATRIX SUBSTRATE

TECHNICAL FIELD

The present invention relates to an active matrix substrate that is formed using an oxide semiconductor and a display device provided with the active matrix substrate.

BACKGROUND ART

An active matrix substrate that is used in a liquid crystal display device or the like has a display area that has multiple pixels and an area (a non-display area or a frame area) other than the display area. Included in the display area is a switching element such as a thin film transistor (hereinafter referred to as "TFT") for every pixel. As such a switching element, a TFT of which an activation layer is an amorphous silicon film (hereinafter referred to as "amorphous silicon TFT"), or a TFT of which an activation layer is a polycrystalline silicon film (hereinafter referred to as "polycrystalline silicon TFT") has been widely used in the related art.

It has been proposed that instead of amorphous silicon or polycrystalline silicon, an oxide semiconductor is used as a material of the activation layer of the TFT. Such a TFT is referred to as an "oxide semiconductor TFT". The oxide semiconductor has mobility higher than the amorphous silicon. For this reason, it is possible that the oxide semiconductor TFT operates at a speed higher than the amorphous silicon TFT.

A semiconductor chip that constitutes a drive circuit, such as a source driver or a gate driver, is mounted in a non-display area (a chip on glass (COG) mounting). In the present specification, an area, in which the semiconductor chip is mounted, of the active matrix substrate is referred to as a "semiconductor chip mounting area". Multiple terminal portions each for connecting a terminal of the semiconductor chip and a gate bus line or a source bus line in the display area are further arranged in the non-display area. These terminal portions are formed, for example, in the semiconductor chip mounting area (that is, are arranged between the semiconductor chip and the substrate).

In some cases, a drive circuit, such as a gate driver or a source driver, is monolithically (integrally) provided in the non-display area. The drive circuit that is monolithically formed is referred to as a "monolithic driver". The monolithic driver is normally configured using the TFT. In recent years, technologies that manufacture the monolithic driver using the oxide semiconductor TFT have been used. Accordingly, cost reduction is realized by narrowing down the frame area or simplifying a mounting process.

In recent years, in most cases, a gate driver circuit has been monolithically formed and a source driver circuit has been mounted using a COG method, in the non-display area in a device such as a smartphone and a tablet with a small size of less than 10 inches, the frame of which is strongly desired to be narrower.

In the non-display area, an inspection circuit is further provided for performing pseudo dynamic lighting inspection that is a method of detecting a failure in a liquid crystal display device (a liquid crystal display panel). Accordingly, it is possible that the failure is detected such as a disconnection or a short circuit on the active matrix substrate.

The inspection circuit includes, for example, multiple TFTs (hereinafter referred to as "inspection TFTs"). Each inspection TFT is connected to the source bus line or the gate bus line. At the lighting inspection, the inspection TFT is caused to enter an ON state, and thus an inspection signal is supplied to the source bus line or the gate bus line. After the lighting inspection, when the liquid crystal display panel normally operates, the inspection TFT is maintained in an OFF state.

In the related art, the inspection TFT is positioned between the semiconductor chip mounting area and the display area, in the non-display area on the side opposite to the side of the semiconductor chip mounting area with the display area interposed therebetween, or the like. In recent years, for the purpose of further narrowing the non-display area, a configuration has been proposed in which the inspection circuit that includes the inspection TFT is positioned within the semiconductor chip mounting area (for example, PTL 1 and PTL 2).

CITATION LIST

Patent Literature

PTL 1: Japanese Unexamined Patent Application Publication No. 2004-101863

PTL 2: Japanese Unexamined Patent Application Publication No. 2014-153493

SUMMARY OF INVENTION

Technical Problem

In configurations that are proposed in PTL 1 and PTL 2, the inspection TFT is positioned at a lower portion of the semiconductor chip. As a result of the study conducted by the inventors of the present application, it is considered that while the liquid crystal display panel normally operates, the semiconductor chip reaches a considerably high temperature (for example, 10 to 20° C. higher than an ambient temperature) and therefore a temperature becomes also high at a lower portion of the semiconductor chip. For this reason, there is a likelihood that a characteristic of the inspection TFT may be shifted due to the temperature and the OFF state may be difficult to maintain, and high reliability cannot be obtained.

Furthermore, in most cases, the inspection TFT is normally formed with a process that is common to the inspection TFT and the pixel TFT and normally has a structure that is the same as or similar to that of the pixel TFT. For this reason, when the inspection TFT that has the characteristic of being able to be resistant to a high temperature is intended to be formed, there is a likelihood that a characteristic of the pixel TFT which is formed with the process that is common to the pixel TFT and the inspection TFT may deviate from a required characteristic.

The embodiments of the present invention has been made in view of the situations described above, and an object thereof is to provide an active matrix substrate that enables reduction in size and that includes a highly reliable inspection TFT which constitutes a lighting inspection circuit.

Solution to Problem

An active matrix substrate according to an embodiment of the present invention has a display area which includes multiple pixel areas and a non-display area other than the display area, the substrate including: a substrate; multiple source bus lines and multiple gate bus lines that are supported on the substrate; multiple pixel TFTs that are supported on the substrate and are arranged in the multiple pixel areas, respectively; multiple inspection TFTs that are connected to at least one of the multiple source bus lines, respectively, and the multiple gate bus lines, respectively, the multiple inspection TFTs being supported on the substrate and being arranged in the non-display area; an inspection circuit that includes the multiple inspection TFTs; multiple terminal portions for connecting the multiple source bus lines or the multiple gate bus lines to terminals of a semiconductor chip that is mounted on the active matrix substrate; and a first insulation layer that is positioned in the display area and the non-display area and covers the multiple pixel TFTs in the display area, in which at least one or more of the multiple inspection TFTs are arranged within a semiconductor chip mounting area in which the semiconductor chip is mounted, and in which each of the multiple inspection TFTs includes a semiconductor layer, a lower gate electrode that is positioned on a side of the substrate of the semiconductor layer with a gate insulation layer in between, an upper gate electrode that is positioned on a side opposite to the side of the substrate of the semiconductor layer with an insulation layer including the first insulation layer in between, and a source electrode and a drain electrode that are connected to the semiconductor layer.

In a certain embodiment, the multiple pixel TFT are bottom gate structure TFTs and are formed using an identical semiconductor film with the semiconductor layers of the multiple inspection TFTs.

In a certain embodiment, the inspection circuit further includes a first inspection gate wiring line that is electrically connected to the lower gate electrodes of the multiple inspection TFTs, and a second inspection gate wiring line that is electrically connected to the upper gate electrodes of the multiple inspection TFTs.

In a certain embodiment, the active matrix substrate further includes a second insulation layer that is positioned on the first insulation layer and includes an organic insulation layer, in which the second insulation layer has one or multiple opening portions that are arranged in such a manner as to overlap, at least in part, the semiconductor layer in each of the multiple inspection TFTs when viewed in a direction normal to the substrate, and in which the second inspection gate wiring line is formed on the second insulation layer and within the opening portion, and a portion, positioned within the opening portion, of the second inspection gate wiring line functions as the upper gate electrode.

In a certain embodiment, the one or multiple opening portions are one opening portion that is provided in such a manner as to overlap an area that includes the semiconductor layers of the multiple inspection TFTs, when viewed in the direction normal to the substrate.

In a certain embodiment, the first inspection gate wiring line includes the lower gate electrode and the second inspection gate wiring line includes the upper gate electrode, and, when viewed in the direction normal to the substrate, the multiple inspection TFTs are arranged in a first direction, and the first inspection gate wiring line and the second inspection gate wiring line extend in the first direction in such a manner as to overlap, at least in part, the semiconductor layers of the multiple inspection TFTs.

In a certain embodiment, when viewed in the direction normal to the substrate, the multiple inspection TFTs are arranged in a first direction, one of the first inspection gate wiring line and the second inspection gate wiring line extends in the first direction in such a manner as to overlap, at least in part, the semiconductor layers of the multiple inspection TFTs, and the other wiring line of the first inspection gate wiring line and the second inspection gate wiring line includes a trunk portion that extends in the first direction and multiple protrusion portions that extend from the trunk portion, in such a manner as to overlap, at least in part, the semiconductor layers of the multiple inspection TFTs.

In a certain embodiment, in each of the multiple inspection TFTs, the semiconductor layer, the source electrode, and the drain electrode are arranged in such a manner that a channel is formed along a second direction that orthogonally intersects the first direction within the semiconductor layer.

In a certain embodiment, the active matrix substrate further includes a lower transparent electrode that is provided on the first insulation layer in the display area; and an upper transparent electrode that is positioned on the lower transparent electrode with a dielectric layer in between, in which the upper gate electrodes of the multiple inspection TFTs are formed from an identical transparent conductive film with the lower transparent electrode and the upper transparent electrode.

In a certain embodiment, the active matrix substrate further includes a circuit that is positioned in the non-display area and includes multiple circuit TFTs, in which the multiple pixel TFTs and the multiple inspection TFTs are oxide semiconductor TFTs, and in which the multiple circuit TFTs are crystalline silicon TFTs.

In a certain embodiment, the inspection circuit further includes other multiple inspection TFTs, each of the other inspection TFTs is connected in series to one of the multiple inspection TFTs, and the other inspection TFTs are crystalline silicon TFTs that are formed using an identical crystalline silicon semiconductor film with the multiple circuit TFTs.

In a certain embodiment, the multiple pixel TFTs and the multiple inspection TFTs are oxide semiconductor TFTs that are formed using an identical oxide semiconductor film.

In a certain embodiment, the oxide semiconductor TFTs are etch stop type TFTs.

In a certain embodiment, the oxide semiconductor TFTs are channel etch type TFTs.

In a certain embodiment, the oxide semiconductor film contains an In—Ga—Zn—O-based semiconductor.

In a certain embodiment, the In—Ga—Zn—O-based semiconductor contains a crystalline portion.

In a certain embodiment, the oxide semiconductor TFT includes an oxide semiconductor layer that has a multilayered structure.

A display device according to another embodiment of the present invention includes any one of the active matrix substrates described above; a semiconductor chip that is mounted on the semiconductor chip mounting area of the active matrix substrate; a counter substrate that is positioned in such a manner as to face the active matrix substrate; and a display medium layer that is provided between the active matrix substrate and the counter substrate.

Advantageous Effects of Invention

According to the embodiment of the present invention, an active matrix substrate that enables size reduction and that includes a highly reliable inspection TFT which constitutes a lighting inspection circuit is provided.

DESCRIPTION OF EMBODIMENTS

First Embodiment

An active matrix substrate according to a first embodiment of the present invention will be described below with reference to the drawings. The active matrix substrate according to the present embodiment finds wide application in various display devices and electronic apparatuses, and the like. At this point, as an example, the active matrix substrate that includes a semiconductor chip which constitutes a source driver circuit and in which a gate driver circuit is monolithically formed is described. It is noted that the active matrix substrate according to the present embodiment may include a semiconductor chip that constitutes at least one of the gate driver circuit and the source driver circuit, and for example, may include a semiconductor chip that constitutes the gate driver circuit.

Figure 1:
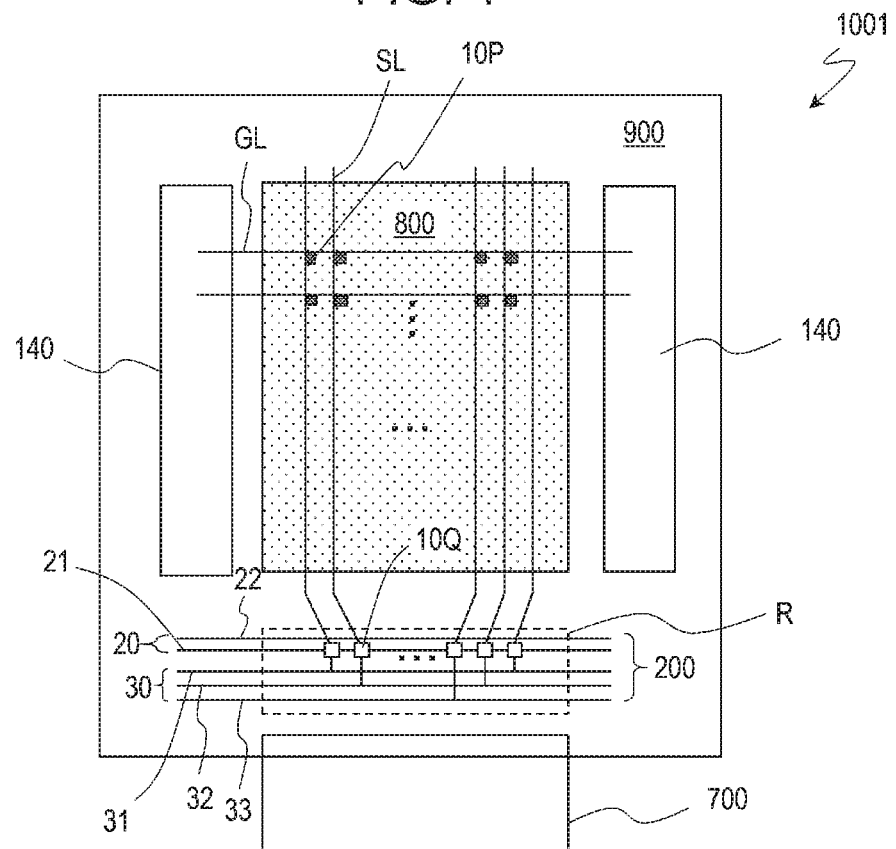
FIG. 1 is a schematic plan view for describing an active matrix substrate 1001 according to a first embodiment.

FIG. 1 is a schematic plan view for describing an active matrix substrate 1001 according to the present embodiment.

The active matrix substrate 1001 has a display area 800 that includes multiple pixel areas and an area (non-display area) 900 other than display area 800. The "pixel area" is an area that corresponds to a pixel in a display device, and, in some cases, is also referred simply to "pixel" in the present specification.

Multiple gate bus lines GL and multiple source bus lines SL are formed in the display area 800, and each of the areas that are defined by these wiring lines is a "pixel". Multiple pixels are arranged in matrix form. Each pixel has a pixel electrode that is not illustrated and a TFT (pixel TFT) 10P that is positioned in the vicinity of each point at which each of the multiple source bus lines SL and each of the multiple gate bus lines GL intersect. The pixel electrode (not illustrated) is formed in each pixel. A source electrode of each pixel TFT 10P is electrically connected to the corresponding source bus line SL, and a gate electrode is electrically connected to the corresponding gate bus line GL. A drain electrode of each pixel TFT 10P is electrically connected to the pixel electrode.

In a case where the active matrix substrate 1001 finds application in the display device that operates in a transverse electrode mode such a Fringe Field Switching (FFS) mode, a common electrode (not illustrated) to which a common signal is applied is provided in the display area 800. The common electrode is connected to a common wiring line (not illustrated). The pixel electrode and the common electrode are arranged in such a manner as to partially overlap each other with a dielectric layer in between. The pixel electrode may be positioned on the common electrode with the dielectric layer in between, and the common electrode may be positioned on the pixel electrode with the dielectric layer in between. In the present specification, in some cases, one electrode that is positioned toward the substrate, of the pixel electrode and the common electrode is referred to as "lower transparent electrode", and the other electrode is referred to as "upper transparent electrode".

Provided in the non-display area 900 are a gate driver circuit 140, an inspection circuit 200, a terminal portion for electrically connecting the gate bus line GL or the source bus line SL, and an external wiring line, and the like.

Moreover, the semiconductor chip (not illustrated) that constitutes the source driver circuit is mounted in the non-display area 900. An area R that is illustrated in FIG. 1 is an area (a semiconductor chip mounting area) in which the semiconductor chip is mounted. Mounted in the non-display area 900 may be a flexible printed substrate (FPC substrate) 700 for supplying power, a signal, and the like from the outside. A semiconductor chip mounting area R, for example, is positioned between the FPC substrate 700 and the display area 800.

The source driver circuit that is constituted by the semiconductor chip, for example, is connected to the source bus line SL through the terminal portion (a terminal pad) that is provided within the semiconductor chip mounting area R. An input terminal of the source driver circuit is connected to an external wiring line that is formed on the FPC substrate 700, through another terminal pad that is formed in the non-display area 900.

The inspection circuit 200 has multiple TFTs (inspection TFTs) 10Q. The multiple inspection TFTs 10Q in the inspection circuit 200 are arranged in the semiconductor chip mounting area R. In this example, all inspection TFTs 10Q that constitute the inspection circuit 200 are arranged in the semiconductor chip mounting area R, but only some of the inspection TFTs 10Q may be arranged within the semiconductor chip mounting area R.

The inspection TFT 10Q is a back gate structure TFT that has a back gate structure. In the present specification, the "back gate structure" refers to a structure that has two gate electrodes between which a semiconductor layer is interposed. A gate electrode that is positioned toward the substrate, of the two gate electrodes of the back gate structure TFT is referred to as "lower gate electrode", and a gate electrode that is positioned in a direction opposite to the substrate is referred to as "upper gate electrode". Any one of the lower gate electrode and the upper gate electrode is positioned in such a manner as to overlap, at least in part, a portion (including a portion in which a channel is formed) of the semiconductor layer, with an insulation layer functioning as a gate insulation film in between. In the following description, in some cases, one of the upper gate electrode and the lower gate electrode is referred to as "front gate electrode" and the other is referred to as "back gate electrode".

On the other hand, the pixel TFT 10P, for example, is a single gate structure TFT. The "single gate structure" refers to a structure in which the gate electrode is positioned, only either toward the substrate, or in a direction opposite to the substrate, on the semiconductor layer. The pixel TFT 10P may have a bottom gate structure in which the gate electrode is provided, toward the substrate, on the semiconductor layer, and may have a top gate structure in which the gate electrode is provided in a direction opposite to the substrate.

In the present embodiment, the inspection TFT 10Q and the pixel TFT 10P are oxide semiconductor TFTs. The inspection TFT 10Q and the pixel TFT 10P may be formed using the same oxide semiconductor film. The pixel TFT 10P, for example, may be a bottom gate structure TFT, and the inspection TFT 10Q may have the same structure as the pixel TFT 10P except that the upper gate electrode is further provided over the semiconductor layer.

It is noted that the inspection TFT 10Q and the pixel TFT 10P are not limited to the oxide semiconductor TFTs and, for example, may be amorphous silicon TFTs or crystalline silicon TFTs. These TFTs may be formed from the same semiconductor film.

Although not illustrated, the active matrix substrate 1001 may further include a TFT in addition to the pixel TFT and the inspection TFT 10Q. For example, the gate driver circuit 140 may include multiple TFTs (circuit TFTs). The circuit TFT may be formed using the same semiconductor film as the inspection TFT 10Q and the pixel TFT 10P. The circuit TFT may have the single gate structure or the back gate structure.

As will be described in detail below, according to the present embodiment, at the time of normal operation of the active matrix substrate 1001, a given negative voltage is applied to a back gate electrode of the inspection TFT 10Q, and thus a change in a characteristic of the inspection TFT 10Q, particularly, shift of a threshold voltage Vth in the negative direction can be suppressed. Therefore, it is possible that, even under high temperature, the inspection TFT 10Q is more reliably maintained in an OFF state, and reliability can be improved.

Moreover, even in a case where the inspection TFT 10Q and the pixel TFT are formed using the same semiconductor film, TFT structures of these are different from each other. Because of this, it is possible that characteristics that are required of these TFTs are compatible. Particularly, in the inspection TFT 10Q, a signal that is supplied to the back gate electrode is controlled, and thus the TFT characteristic that is required of the inspection TFT 10Q can be realized.

<Inspection Circuit 200>

Figure 2A:
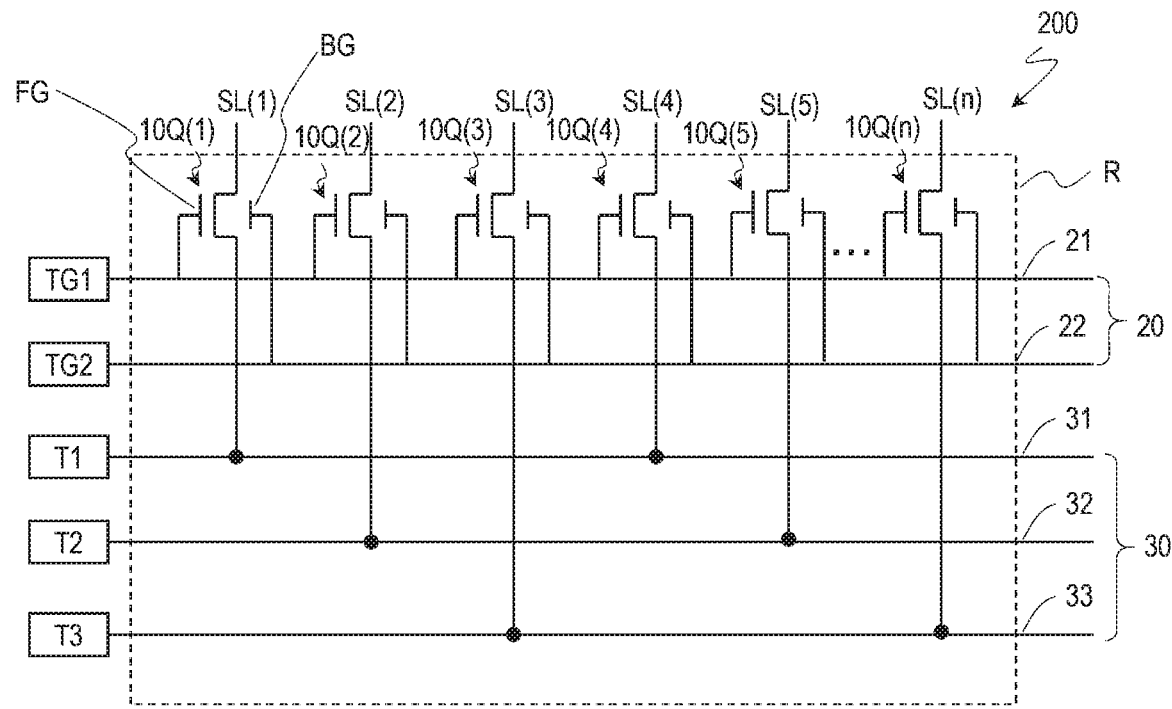
FIG. 2A is a diagram illustrating an example of an inspection TFT 10Q in the active matrix substrate 1001.

FIG. 2A is a circuit diagram illustrating an example of the inspection circuit 200.

The inspection circuit 200 includes multiple inspection TFTs 10Q (1) to 10Q(n) (hereinafter collectively referred to as an inspection TFT 10Q in some cases) that are connected to the multiple source bus lines SL(1) to SL(n) (n is an integer) (hereinafter collectively referred to as a source bus line SL in some cases), an inspection gate wiring line 20, an inspection wiring line 30, and inspection gate terminals TG1 and TG2 and inspection terminals T1, T2, and T3, through which signals are supplied to these wiring lines.

In this example, the inspection gate wiring line 20 includes a first inspection gate wiring line 21 and a second inspection gate wiring line 22. Through the inspection gate terminal TG1, a signal is supplied to the first inspection gate wiring line 21, and through the inspection gate terminal TG2, a signal is supplied to the second inspection gate wiring line 22. The inspection wiring line 30 includes a first inspection wiring line 31, a second inspection wiring line 32, and a third inspection wiring line 33. Through the inspection terminals T1 to T3, signals are supplied to the first inspection wiring line 31 to the third inspection wiring line 33, respectively.

A front gate electrode FG (for example, a lower gate electrode) of each inspection TFT 10Q is electrically connected to the first inspection gate wiring line 21, and a back gate electrode BG of each inspection TFT 10Q is electrically connected to the second inspection gate wiring line 22. The first inspection gate wiring line 21 and the second inspection gate wiring line 22 are common to all inspection TFTs 10Q.

A drain electrode of each inspection TFT 10Q is connected to one corresponding source bus line SL.

A source electrode of each inspection TFT 10Q is connected to any of the inspection wiring lines 30. For example, the inspection TFTs 10Q(1) and 10Q(4) are connected to the first inspection wiring line 31, the inspection TFTs 10Q(2) and 10Q(5) are connected to the second inspection wiring line 32, and the inspection TFTs 10Q(3) and 10Q(n) are connected to the third inspection wiring line 33.

Among pixels that are arranged in matrix form in the display area, a group of multiple pixels that are arranged in the column direction and to which a source signal is supplied from one source bus line SL is referred to as "pixel array". In this example, the pixel array in the display area includes a first pixel array to which a source signal is supplied from the inspection terminal T1 and the first inspection wiring line 31, a second pixel array to which a source signal is supplied from the inspection terminal T2 and the second inspection wiring line 32, and a third pixel array to which a source signal is supplied from the inspection terminal T3 and the third inspection wiring line 33. The first pixel array, the second pixel array, and the third pixel array, for example, may correspond to pixels arrays for red (R), green (G), and blue (B), respectively. That is, the inspection terminals T1 to T3, for example, may correspond to the pixel arrays for red (R), green (G), and blue (B).

In the present embodiment, multiple inspection TFTs 10Q of the inspection circuit 200 are arranged within the semiconductor chip mounting area R. It is preferable that all inspection TFTs 10Q that constitute the inspection circuit 200 are arranged in the semiconductor chip mounting area R, but only some of the inspection TFTs 10Q may be arranged in the semiconductor chip mounting area R. The entire inspection circuit 200 that includes the wiring lines 20 and 30 and inspection terminal portions may be arranged within the semiconductor chip mounting area R. Alternatively, as illustrated, some (including connection portions of the inspection TFT 10Q and each of the wiring lines 20 and 30) of the inspection TFT 10Q and the wiring lines 20 and 30 may be arranged within the semiconductor chip mounting area R, and others of the inspection terminal portion and the wiring lines 20 and 30 may be arranged outside of the semiconductor chip mounting area R.

Figure 2B:
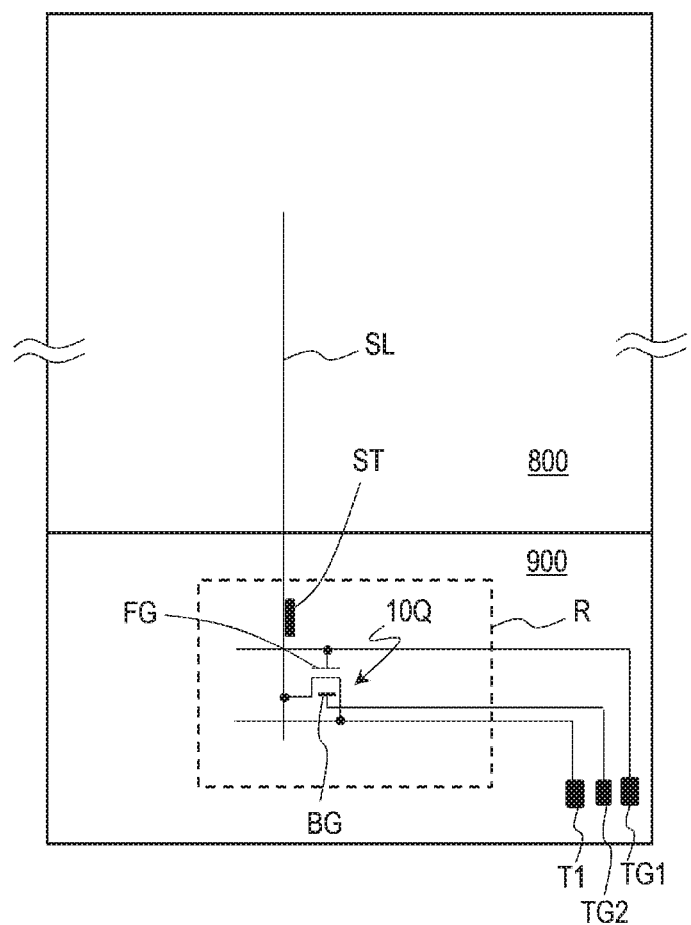
FIG. 2B is a diagram illustrating a configuration of a semiconductor chip mounting area R.

FIG. 2B is a diagram illustrating a configuration of the semiconductor chip mounting area R. At this point, only a single inspection TFT 10Q is illustrated. In this example, the inspection terminal portions such as the inspection gate terminals TG1 and TG2 and the inspection terminal T1 are arranged outside of the semiconductor chip mounting area R. Furthermore, within the semiconductor chip mounting area R, a terminal pad ST for connecting each source bus line SL and the source driver circuit of the semiconductor chip is positioned, toward the display area, in the inspection circuit 200. The terminal pad ST, for example, may be formed on the same layer as the back gate BG. It is noted that a position of the terminal pad ST is not limited to an example that is illustrated. For example, in the semiconductor chip mounting area R, the inspection circuit 200 may be positioned closer to the display area than the terminal pad ST.

In the inspection circuit 200, at the time of lighting inspection, with signals that are supplied from the inspection gate terminal TG1 and the inspection gate terminal TG2 to the front gate electrode FG and the back gate electrode BG, respectively, of the inspection TFT 10Q, all inspection TFTs 10Q are in an ON state. As a result, a signal can be supplied from the inspection wiring line 30 to each source bus line SL, and the lighting inspect can be performed. After the lighting inspection, when a normal operation is performed, a gate voltage of the inspection TFT 10Q is controlled in such a manner that the inspection TFT 10Q is in the OFF state. For example, a negative voltage is applied to the front gate electrode FG and the back gate electrode BG through the first inspection gate wiring line 21 and the second inspection gate wiring line 22, respectively, and thus the inspection TFT 10Q may be maintained in the OFF state.

A voltage that is applied to the back gate electrode BG of the inspection TFT 10Q may be controlled separately from a voltage that is applied to the front gate electrode FG. Alternatively, the same voltage may be applied to the front gate electrode FG and the back gate electrode BG. For example, the first inspection gate wiring line 21 and the second inspection gate wiring line 22 may be connected to one common inspection terminal, and the same signal may be supplied to the front gate electrode FG and the back gate electrode BG of the inspection TFT 10Q.

The number of inspection wiring lines 30 may be 1 or greater, and is not limited to an example (three inspection wiring lines 30) that are illustrated. For example, in the case of application in display panels that are driven with a frame inversion method, two inspection wiring lines may be provided to each of the pixel arrays for R, G, and B. It is noted that in FIG. 2A, an example in which one inspection TFT 10Q is positioned to one source bus line SL is illustrated, but that one inspection TFT 10Q may be provided to multiple source bus lines SL.

Moreover, instead of the semiconductor chip that constitutes the source driver circuit, the semiconductor chip that constitutes the gate driver circuit may be mounted in the active matrix substrate 1001. In this case, the inspection TFT 10Q is provided a mounting area for the semiconductor chip that constitutes the gate driver circuit. A configuration of an inspection circuit is the same as that which is illustrated in FIG. 2A. However, the drain electrode of the inspection TFT 10Q is connected to the corresponding gate bus line GL. A signal that is supplied from the inspection wiring line 30 is input into each gate bus line GL through the inspection TFT 10Q.

<Back Gate Structure TFT and Effect Thereof>

Figure 3:
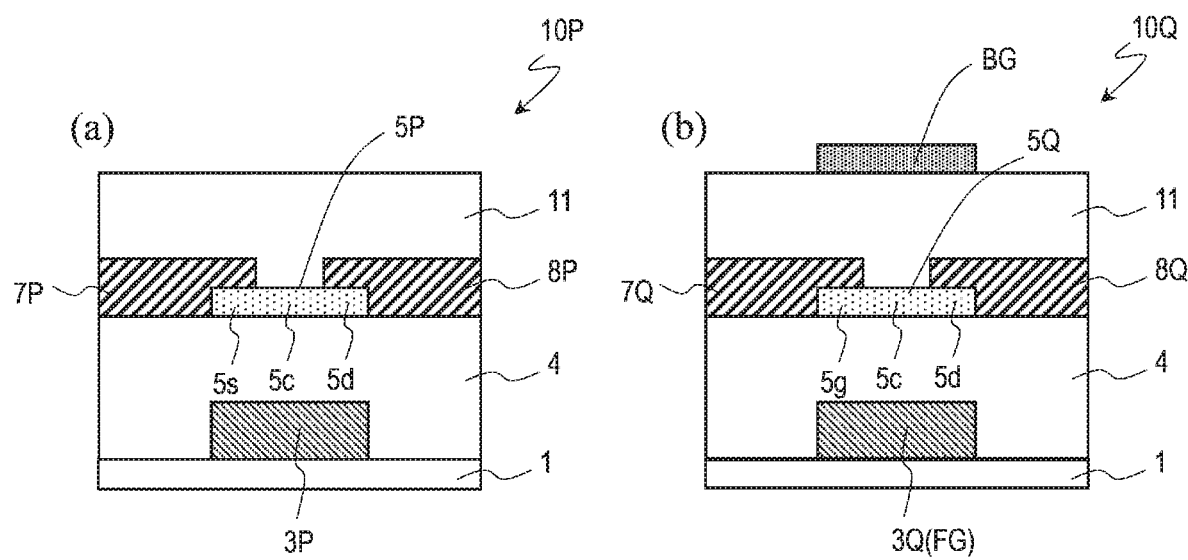
FIGS. 3(a) and 3(b) are schematic cross-sectional diagrams of a pixel TFT 10P and the inspection TFT 10Q, respectively.

FIGS. 3(*a*) and 3(*b*) are schematic cross-sectional diagrams that illustrate examples of the pixel TFT 10P and the inspection TFT 10Q, respectively.

The pixel TFT 10P and the inspection TFT 10Q is supported on a common substrate 1. The pixel TFT 10P, for example, has the bottom gate structure. The inspection TFT 10Q has the same structure as the pixel TFT 10P except that the back gate electrode is provided over the oxide semiconductor layer.

The pixel TFT 10P and the inspection TFT 10Q have gate electrodes 3P and 3Q, respectively, that are provided on the substrate 1, gate insulation layers 4, respectively, which covers the gate electrodes 3P and 3Q, respectively, oxide semiconductor layers 5P and 5Q, respectively, that are arranged on the gate insulation layer 4, source electrodes 7P and 7Q, respectively, and drain electrodes 8P and 8Q, respectively. The oxide semiconductor layers 5P and 5Q are arranged in such a manner as to overlap, at least in part, the gate electrodes 3P and 3Q, respectively, when viewed in a direction normal to the substrate 1.

The source electrodes 7P and 7Q and the drain electrodes 8P and 8Q are electrically connected to the oxide semiconductor layers 5P and 5Q, respectively. Areas in contact with the source electrodes 7P and 7Q, of the oxide semiconductor layer 5P and 5Q, respectively, are referred to as source contact areas 5s, and areas in contact with the drain electrodes 8P and 8Q, respectively, are referred to as drain contact areas 5d. Channels are formed within areas 5c, respectively, that are positioned between the source contact area 5s and the drain contact area 5d, respectively, of the oxide semiconductor layers 5P and 5Q and overlap the gate electrodes 3P and 3Q, respectively, with the gate insulation layer 4 in between. In the present specification, the area 5c that includes a portion which is a channel is referred to as "channel region" for convenience. A length in the channel length direction, of the channel region 5c is referred to as "channel length L", and a length in the direction that orthogonally intersects the channel length direction of the channel region 5c is referred to as "channel width W". It is noted that, in an actual TFT, in some cases, with diffusion or the like of impurity atoms or the like into the channel region 5c, the entire channel region 5c does not function as a channel.

A first insulation layer 11 is formed in such a manner as to cover the oxide semiconductor layers 5P and 5Q, the source electrodes 7P and 7Q, and the drain electrodes 8P and 8Q, respectively. The inspection TFT 10Q has another gate electrode (hereinafter referred to as "back gate electrode") BG that is positioned on a first insulation layer 11. For distinction from the back gate electrode BG, a gate electrode 3Q of the inspection TFT 10Q is hereinafter "front gate electrode". In this example, the first insulation layer 11 functions as a gate insulation layer of the back gate electrode BG. The back gate electrode BG is positioned in such a manner as to overlap, at least in part, the channel regions 5c of an oxide semiconductor layer 5Q, when viewed in the direction normal to the substrate 1. The back gate electrode BG may be positioned in such a manner as to cover the entire oxide semiconductor layer 5Q.

A material of the back gate electrode BG is not particularly limited. Although not illustrated, the back gate electrode BG may be formed from the same transparent conductive film as the pixel electrode or the common electrode that is provided in each pixel. The back gate electrode BG does not need to have optical transparency, and because of this, may be a metal film that has a light shielding property. For example, the active matrix substrate may further include a metal wiring line that is electrically separated from the pixel electrode and the common electrode, and the back gate electrode BG may be formed using the same metal film as the metal wiring line. The metal wiring line, for example, may be a wiring line that is provided in such a manner as to be in contact with a portion of the common electrode, in order to lower resistance of the common electrode (the lower transparent electrode).

On the other hand, the back gate electrode is not provided over the pixel TFT 10P. That is, the pixel TFT 10P has the single gate structure.

In the present embodiment, the oxide semiconductor layers 5P and 5Q each are formed from the oxide semiconductor film. Furthermore, the source electrodes 7P and 7Q and the drain electrodes 8P and 8Q are formed from the same conductive film.

According to the present embodiment, even in a case where the inspection TFT 10Q and the pixel TFT 10P are formed on the same substrate by performing common processing, a characteristic of the inspection TFT 10Q can be controlled independently of the pixel TFT 10P. Specifically, a given voltage is applied to the back gate electrode BG of the inspection TFT 10Q, and thus it is possible that a threshold of the inspection TFT 10Q is controlled separately from another TFT, such as the pixel TFT 10P, on the same substrate.

Characteristics of the single gate structure TFT and the back gate structure TFT will be described below with reference to the drawings.

Figure 4:
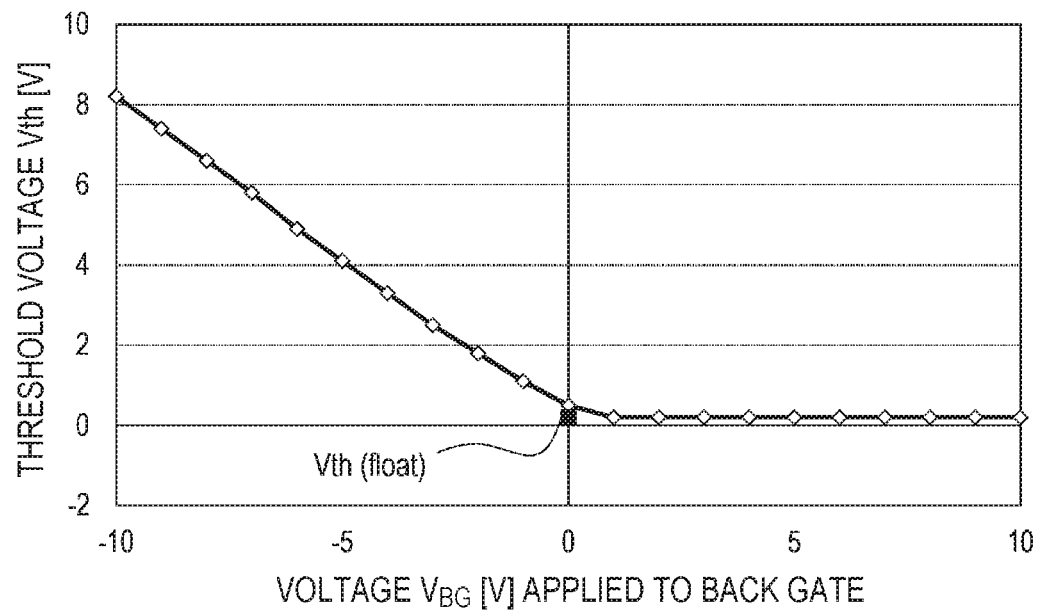
FIG. 4 is a diagram illustrating a relationship between a voltage $V_{BG}$ that is applied to a back gate electrode, and a threshold voltage Vth of a back gate structure TFT.
Figure 5:
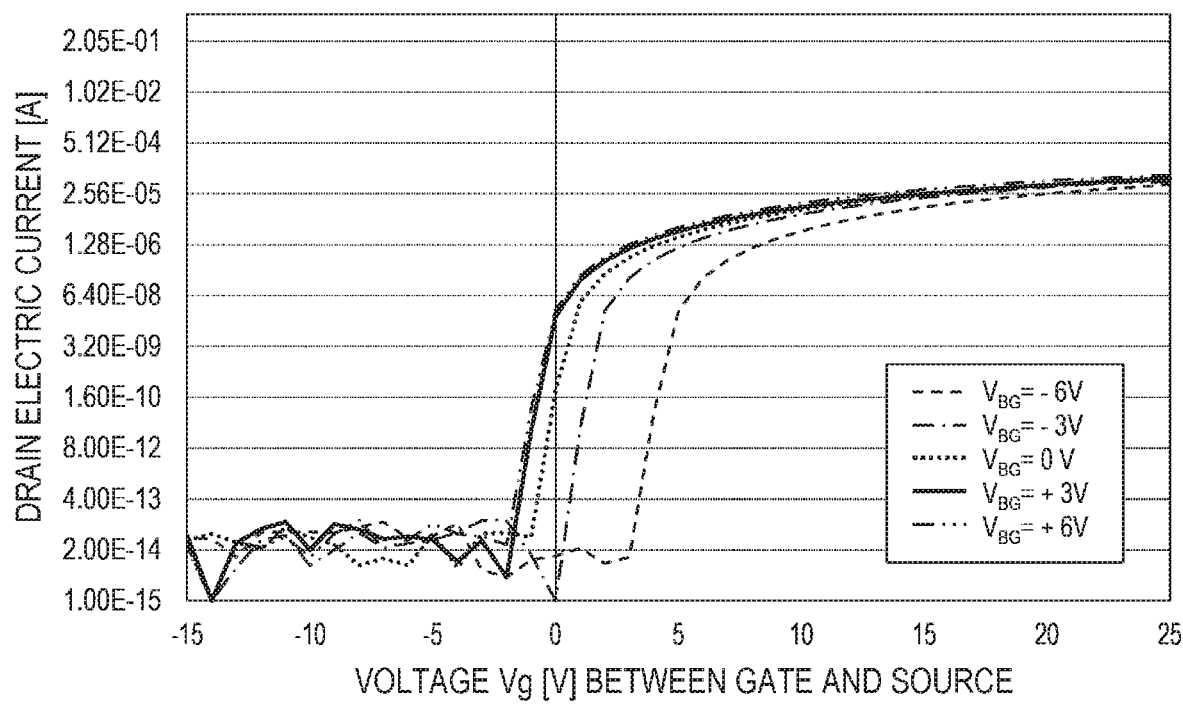
FIG. 5 is a diagram illustrating the dependence of an Id-Vg characteristic of a back gate structure TFT on back gate electric potential.

FIG. 4 is a diagram illustrating a relationship between a voltage $V_{BG}$ that is applied to the back gate structure TFT, and the threshold voltage Vth of the back gate electrode. In FIG. 4, a threshold voltage $Vth_{(float)}$ in a case where the back gate electrode is in a floating state. FIG. 5 is a diagram illustrating the dependence of an Id-Vg characteristic of the back gate structure TFT on back gate electric potential.

From FIGS. 4 and 5, it is understood that, when a negative voltage is applied to the back gate electrode, the threshold voltage Vth is shifted in the positive direction.

Figure 6:
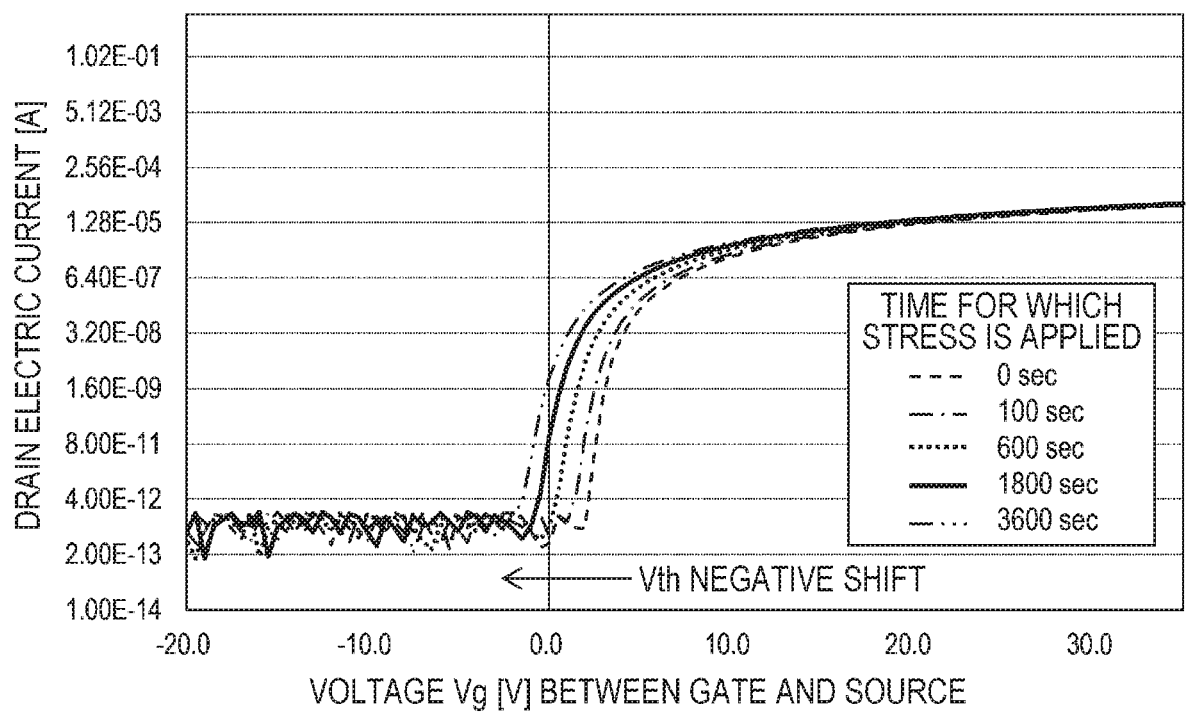
FIG. 6 is a diagram illustrating a change in the Id-Vg characteristic of a single gate structure TFT with respect to optical negative bias stress.
Figure 7:
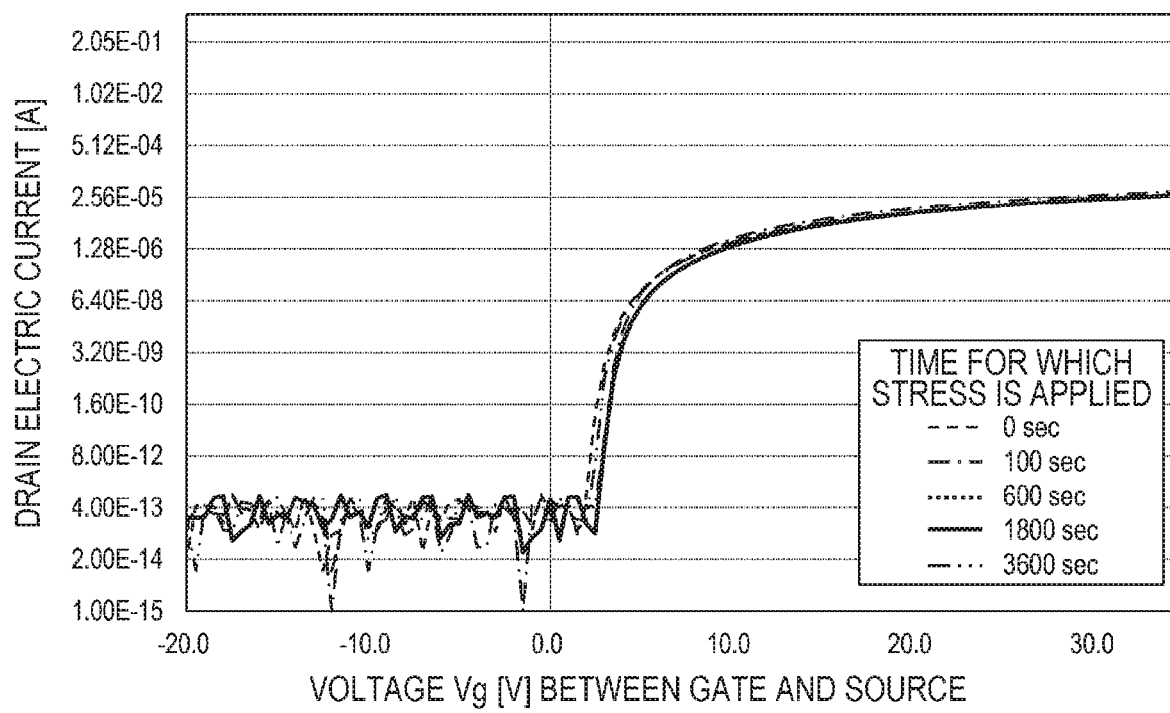
FIG. 7 is a diagram illustrating a change in the Id-Vg characteristic of the back gate structure TFT with respect to the optical negative bias stress.

FIGS. 6 and 7 are diagrams changes in the Id-Vg characteristics of the single gate structure TFT and the back gate structure TFT, respectively, with respect to optical negative bias stress.

As illustrated in FIG. 6, in the single gate structure TFT, as the time for which the optical negative bias stress is lengthened, the threshold voltage Vth is shifted in the negative direction. On the other hand, in the back gate structure TFT, as illustrated in FIG. 7, although, with the application of the negative voltage to the back gate electrode, the negative bias stress is applied, it is possible that the threshold voltage Vth is retained approximately constantly.

As a result of the study by the inventor in the present application, it was found that, in the single gate structure TFT that was in operation under a high temperature environment, the shift of the threshold voltage Vth in the negative direction was accelerated, but that, in back gate structure TFT, with the application of the negative voltage to the back gate electrode, a change in threshold voltage Vth due to temperature could be suppressed.

After the lighting inspection, when a display device normally operates, an inspection TFT is maintained in the OFF state. When the threshold voltage Vth of the inspection TFT is shifted in the negative direction, there is a likelihood that the inspection TFT will be out of the OFF state. Particularly, when the inspection TFT is positioned at a lower portion of the semiconductor chip, the in-operation inspection TFT of the display device is exposed to high temperature. As a result of this, the shift of the threshold voltage Vth in the negative direction is accelerated under the influence of the temperature. For this reason, the OFF state is difficult to maintain. When the in-operation inspection TFT of the display device is out of the ON state, this can cause the active matrix substrate and the display device to fail to operate. In contrast, in the present embodiment, the inspection TFT 10Q has the back gate structure, a voltage that is to be applied to the back gate electrode is controlled. Thus, a change in the TFT characteristic can be suppressed. For this reason, because the OFF state of the inspection TFT 10Q can be more reliably maintained as is, the reliability of each of the active matrix substrate and the display device can be increased.

<Specific Structure of the Active Matrix Substrate 1001>

Subsequently, taking as an example the active matrix substrate that operates in the frame inversion method and that finds application in the display device which operates in an FFS mode, the pixel area and the inspection circuit 200 in the active matrix substrate 1001 according to the present embodiment are described in more detail with reference to the drawings. The FFS mode is a mode in compliance with a transverse electric field method in which a pair of electrodes is provided on one substrate and in which an electric field is applied, in a direction (in the horizontal direction) in parallel to a surface of the substrate, to liquid crystal molecules.

Figure 8:
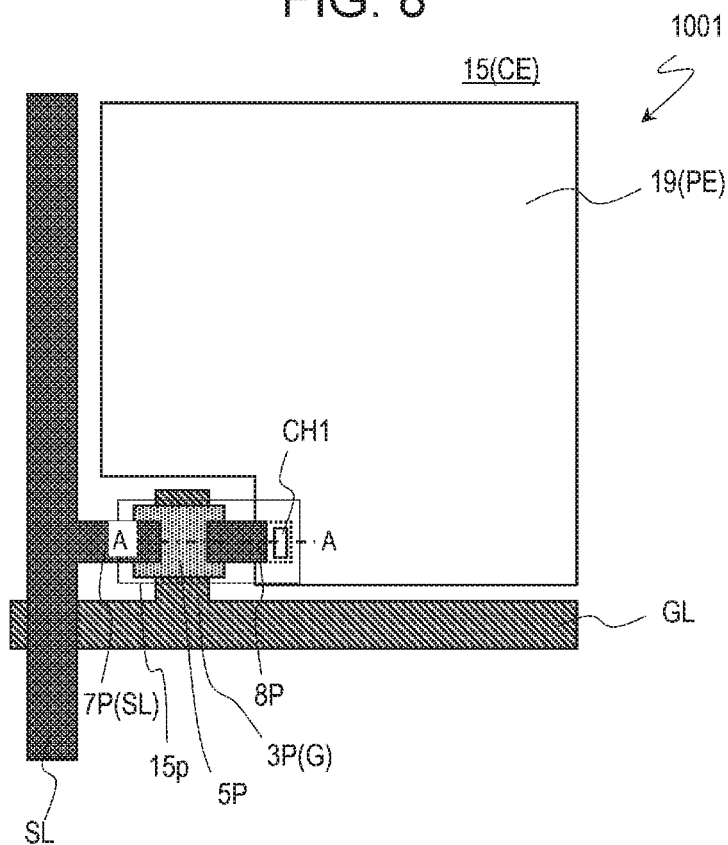
FIG. 8 is a schematic plan view illustrating one pixel area in the active matrix substrate 1001.
Figure 9:
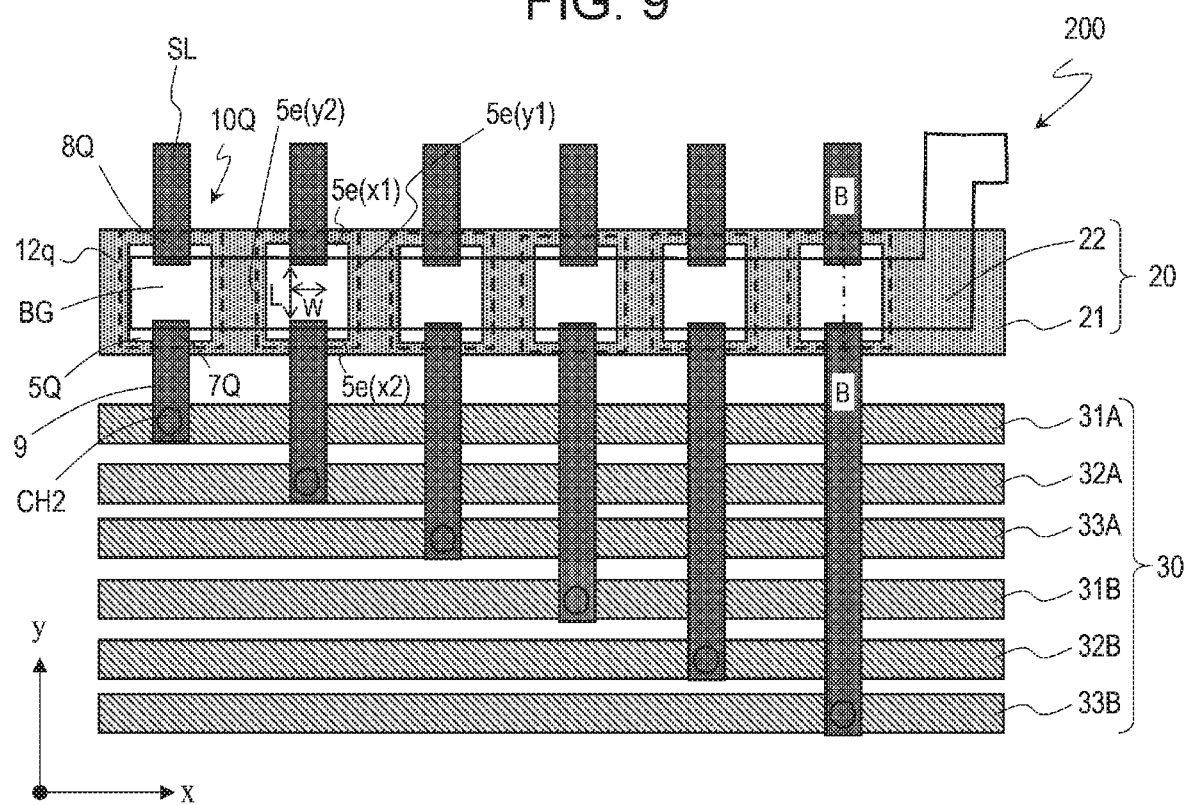
FIG. 9 is a schematic plan view of an inspection circuit 200 in the active matrix substrate 1001.
Figure 10:
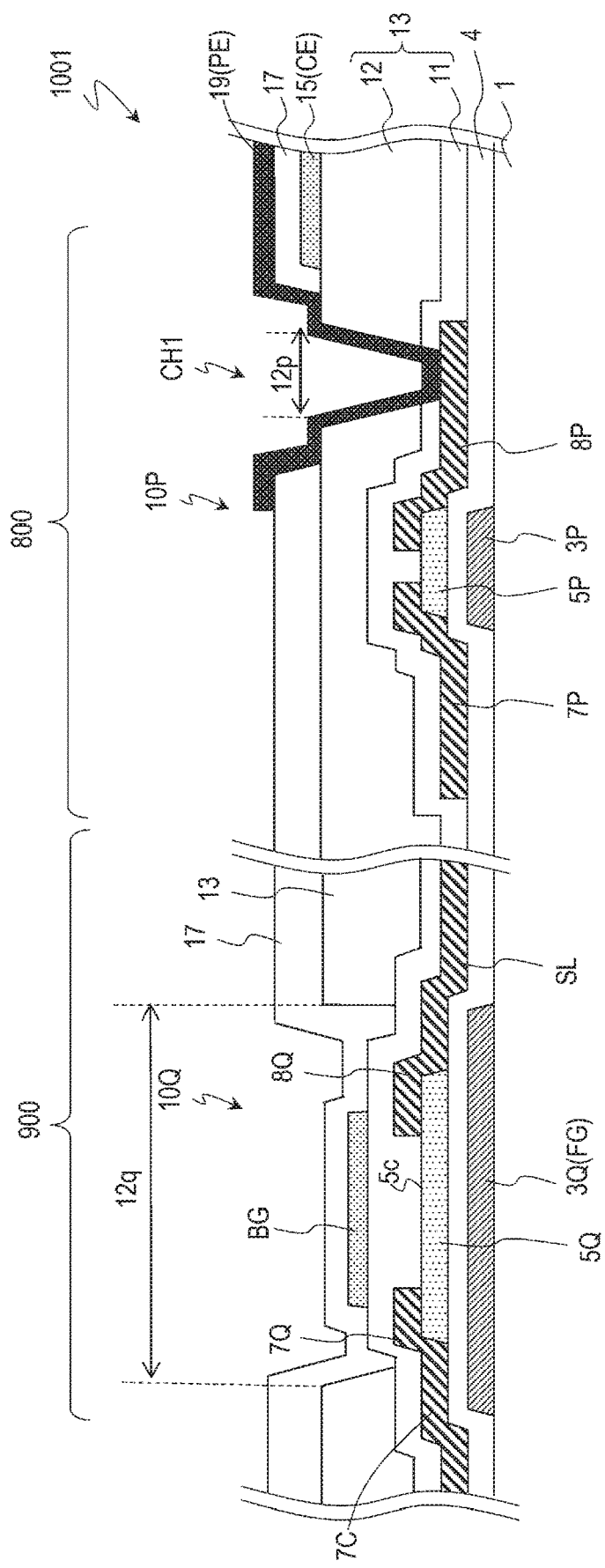
FIG. 10 is a schematic cross-sectional diagram illustrating the inspection TFT 10Q and the pixel TFT 10P in the active matrix substrate 1001.

FIG. 8 is a schematic plan view illustrating one pixel area in the active matrix substrate 1001. FIG. 9 is a schematic plan view of the inspection circuit 200 in the active matrix substrate 1001. FIG. 10 is a schematic cross-sectional diagram illustrating an example of the inspection TFT 10Q and the pixel TFT 10P. In FIG. 10, a cross-section of the inspection TFT 10Q taken line B-B in FIG. 9 and a cross-section of the pixel TFT 10P taken along line A-A in FIG. 8 are illustrated. In FIGS. 8 to 10, the reference numerals that are the same as those in FIGS. 1 to 3 are assigned. A difference from the configuration described above is described here in an emphasized manner with reference to FIGS. 1 to 3.

Configuration of the Pixel Area

First, a configuration of the pixel TFT 10P and the pixel area is described with reference to FIGS. 9 and 10.

Each of the pixel areas has the pixel TFT 10P, the gate bus line GL, the source bus line SL, the pixel electrode PE, and the common electrode CE.

The pixel TFT 10P has a configuration that is described above with reference to FIG. 3. The pixel TFT 10P is covered with an inter-layer insulation layer 13 that includes the first insulation layer 11 and a second insulation layer 12 that is formed on the first insulation layer 11. The first insulation layer 11, for example, is an inorganic insulation layer (a passivation layer, and may be a SiNx layer, a SiOx layer, or the like. A thickness of the first insulation layer 11, for example, is equal to or greater than 100 nm and is equal to or smaller than 500 nm. The second insulation layer 12 includes an organic insulation layer. The second insulation layer 12 is thicker than the first insulation layer 11, and a thickness thereof, for example, is equal to or greater than 1 μm and is equal to or smaller than 3 μm. The second insulation layer 12 is used to level a surface of an upper layer of the pixel TFT, to reduce an electrostatic capacity that is formed between the pixel electrode and the source wiring line, and so on.

Formed over the inter-layer insulation layer 13 are a lower transparent electrode 15 and an upper transparent electrode 19 that is positioned on the lower transparent electrode 15 with a dielectric layer 17 in between. Although not illustrated, the upper transparent electrode 19 has a slit or a notched portion in every pixel. In this example, the lower transparent electrode 15 is the common electrode CE, and the upper transparent electrode 19 is the pixel electrode PE. This electrode structure is disclosed, for example, in International Publication No. 2012/086513. It is noted that the lower transparent electrode 15 may be the pixel electrode PE and that the upper transparent electrode 19 may be the common electrode CE. This electrode structure is described, for example, in Japanese Unexamined Patent Application Publication Nos. 2008-032899 and 2010-008758. For reference, the entire contents of International Publication No. 2012/086513 and Japanese Unexamined Patent Application Publication Nos. 2008-032899 and 2010-008758 are incorporated in the present specification by reference.

The pixel electrode PE (here, the upper transparent electrode 19) is separated from every pixel. The drain electrode 8P of the pixel TFT 10P is electrically connected to the corresponding pixel electrode PE. In this example, a contact hole (a pixel contact hole) CH1 that extends to the drain electrode 8P is formed on the inter-layer insulation layer 13, and the upper transparent electrode 19 is provided on the inter-layer insulation layer 13 and within the pixel contact hole CH1, in such a manner as to be brought into direct contact with the drain electrode 8P within the pixel contact hole CH1.

The common electrode CE (here, the lower transparent electrode 15) may not be separated from every pixel. The common electrode CE may be formed over almost all portions of the display area, except for an area that is positioned on the pixel TFT 10P. In this example, the common electrode CE has an opening portion 15p that overlaps the pixel TFT 10P and the contact hole CH1 for making a connection to the pixel TFT 10P and the pixel electrode 19, when viewed in the direction normal to the substrate 1.

Configuration of the Inspection Circuit 200

Subsequently, a configuration of each of the inspection TFT 10Q and the inspection circuit 200 is described with reference to FIGS. 9 and 10.

The inspection TFT 10Q has the same configuration as the pixel TFT 10P that is illustrated in FIG. 10. However, the second insulation layer 12 has an opening portion 12q over the inspection TFT 10Q. The opening portion 12q is positioned in such a manner as to overlap at least the entire channel regions 5c of the inspection TFT 10Q, when viewed in the direction normal to the substrate 1. The opening portion 12q may be arranged in such a manner as to overlap the entire oxide semiconductor layer 5Q. The back gate electrode BG is positioned within the opening portion 12q. The back gate electrode BG is positioned in such a manner as to overlap, at least in part, the oxide semiconductor layer 5Q, with an insulation film including the first insulation layer 11 in between. The back gate electrode BG is formed using the same transparent conductive film as the lower transparent electrode (here, the common electrode) and is in contact with an upper surface of the first insulation layer 11.

It is noted that, for example, a structure in which a back gate electrode is provided on an organic insulation layer is proposed in Japanese Unexamined Patent Application Publication No. 2014-103142. However, when the back gate electrode is provided on the organic insulation layer, a comparatively thick organic insulation layer is interposed between the semiconductor layer and the back gate electrode. Thus, an effect of suppressing a change in the threshold voltage is reduced. In contrast, in the present embodiment, the opening portion 12q is provided in the second insulation layer 12, and thus the organic insulation layer is not interposed between the back gate electrode BG and the oxide semiconductor layer 5Q. Between the back gate electrode BG and the oxide semiconductor layer 5Q, only a comparatively thin inorganic insulation film (the first insulation layer 11 and an etch stop layer in an etch stop structure, and the first insulation layer 11 in a channel etch structure). Because of this, it is possible that the control of the threshold of the inspection TFT 10Q by the back gate electrode BG is suitably performed.

The inspection circuit 200 includes multiple inspection TFTs 10Q, multiple inspection gate wiring lines 20, and multiple inspection wiring lines 30. When viewed in the direction normal to the substrate 1, within the semiconductor chip mounting area R, the inspection TFT 10Q may be positioned in a first direction, and the inspection gate wiring line 20 and the inspection wiring line 30 may extend in the first direction. A direction (the first direction) of the arrangement of the inspection TFTs 10Q may be a direction (an x direction) that orthogonally intersects a direction (a y direction or a second direction) in which source bus line SL extends in the display area. The inspection TFT 10Q and the inspection gate wiring line 20 are positioned closer to the display area than the inspection wiring line 30.

The inspection gate wiring line 20 includes the first inspection gate wiring line 21 and the second inspection gate wiring line 22. The second inspection gate wiring line 22 may extend in such a manner as to overlap the first inspection gate wiring line 21 when viewed in the direction normal to the substrate 1.

The inspection wiring line 30 includes the first inspection wiring line 31 to the third inspection wiring line 33 that supplies source signals to first to third pixel arrays, respectively. In a case where the active matrix substrate 1001 finds application in a liquid crystal display device that is driven using the frame inversion method, each of the first to third pixel arrays includes a pixel array A and a pixel array B to which a signal that is different in polarity from that which is supplied to the pixel array A is supplied. Each of the first inspection wiring line 31 to the third inspection wiring line 33 includes two wiring lines (a first inspection wiring line 31A and a first inspection wiring line 31B, a second inspection wiring line 32A and a second inspection wiring line 32B, and a third inspection wiring line 33A and a third inspection wiring line 33B, respectively) for supplying signals different in polarity to the pixel arrays A and B, respectively. In a case where the display device is driven using a column inversion method (a method in which a pixel in the column direction for every frame is inverted alternatively between positive polarity and negative polarity), the first to third pixel arrays correspond to the pixel arrays for R, G, and B, respectively. In the case of the driving using a zigzag inversion method, the first to third pixel arrays correspond to pixels of RG, GB, and BR, respectively.

The gate electrode 3Q of each inspection TFT 10Q is electrically connected to the first inspection gate wiring line 21, and the back gate electrode BG is electrically connected to the second inspection gate wiring line 22.

The first inspection gate wiring line 21, the inspection wiring line 30, and the gate electrodes 3P and 3Q may be formed within a gate metal layer (a layer that is formed using the same conductive film as the gate bus line GL). In this case, the first inspection gate wiring line 21 and the gate electrode 3Q may be integrally formed. That is, the first inspection gate wiring line 21 may include a portion that functions as the gate electrode 3Q.

As illustrated, multiple inspection TFTs 10Q may be arranged on the first inspection gate wiring line 21. At this point, at least the oxide semiconductor layer 5Q of the inspection TFT 10Q overlaps the first inspection gate wiring line 21 with the gate insulation layer 4 in between. In this case, a portion that overlaps each oxide semiconductor layer 5Q, of the first inspection gate wiring line 21 functions as the gate electrode 3Q.

Furthermore, the second inspection gate wiring line 22 and the back gate electrode BG may be formed using the same transparent conductive film as the lower transparent electrode (here, the common electrode). In this example, the second inspection gate wiring line 22 is arranged on the inter-layer insulation layer 13 and within the opening portion 12q. A portion that is positioned within the opening portion 12q and overlaps each oxide semiconductor layer 5Q with the insulation layer in between, of the second inspection gate wiring line 22 functions as the back gate electrode BG of the inspection TFT 10Q.

As illustrated, the second inspection gate wiring line 22 may extend in such a manner as to overlap the oxide semiconductor layers 5Q of multiple inspection TFTs 10Q when viewed in the direction normal to the substrate 1. At this point, the second inspection gate wiring line 22 extends in such a manner as to cross multiple opening portions 12q each of which is positioned on the oxide semiconductor layer 5Q of the inspection TFT 10Q, when viewed in the direction normal to the substrate 1. A portion that is positioned within the opening portion 12q and overlaps each oxide semiconductor layer 5Q with the first insulation layer 11, of the second inspection gate wiring line 22 functions as the back gate electrode BG.

Each drain electrode 8Q of the inspection TFT 10Q is connected to the corresponding source bus line SL. As illustrated, the source bus line SL may extend up to a portion of the oxide semiconductor layer 5Q and thus may come into contact with the oxide semiconductor layer 5Q. In this case, a portion in contact with the oxide semiconductor layer 5Q, of the source bus line SL functions as the drain electrode.

A source electrode 7Q of each inspection TFT 10Q is connected to one wiring line of the inspection wiring line 30. As illustrated, a wiring line 9 that is integrally combined with the source electrode 7Q may extend up to a wiring line that is to be connected, of the inspection wiring line 30. In the present specification, the wiring line 9 that is integrally combined with the source electrode 7Q and includes the source electrode 7Q is referred to as "connection wiring line". A connection wiring line 9 may be formed within a source metal layer (a layer that is formed using the same conductive film as the source bus line SL). In this case, the connection wiring line 9, for example, is connected to one wiring line of the inspection wiring line 30, within an opening portion CH2 that is provided in the gate insulation layer. Alternatively, the connection wiring line 9, for example, may be electrically connected to the inspection wiring line 30 through a connection portion that is formed from the same conductive film as the lower transparent electrode.

Furthermore, in an example that is illustrated in FIG. 9, in each inspection TFT 10Q, the source electrode 7Q and the drain electrode 8Q are arranged in such a manner that a channel is formed along the y direction. Specifically, the arrangement is made as follows. Each oxide semiconductor layer 5Q, when viewed in the direction normal to the substrate 1, for example, is rectangular, and has two edges, edges 5e(x1) and 5e(x2), that extend in the x direction and face each other, and two edges, edges 5e(y1) and 5e(y2) that extend in the y direction and face each other. The source bus line SL (including the drain electrode 8Q) is in contact with the oxide semiconductor layer 5Q, in the vicinity of the edge 5e(x1) that is present toward the display area, of the oxide semiconductor layer 5Q. The connection wiring line 9 (including the source electrode 7Q) is in contact with the oxide semiconductor layer 5Q, in the vicinity of the edge 5e(x2) that is opposite in direction to the oxide semiconductor layer 5Q. In this configuration, a channel length direction in the channel region of the inspection TFT 10Q is the y direction. In a case where the source bus line SL and the connection wiring line 9 are the same in width, a width of the wiring line is the channel width W.

First Modification Example

Figure 11:
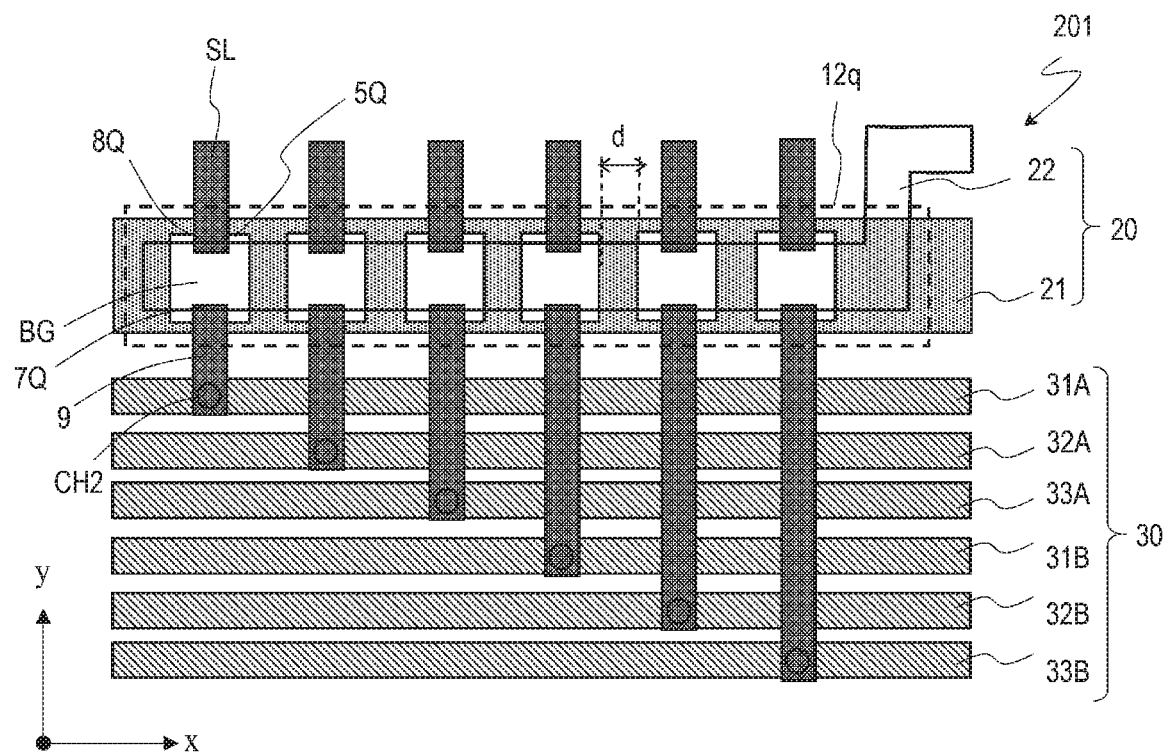
FIG. 11 is a plan view illustrating an inspection circuit 201 of a first modification example in the first embodiment.

FIG. 11 is a plan view illustrating the inspection circuit of a first modification example in the present embodiment.

In an inspection circuit 201 that is the first modification example, the second insulation layer 12 has one opening portion 12q for multiple inspection TFTs 10Q. A structure other than this structure is the same as that of the inspection circuit 200 that is illustrated in FIG. 9. A difference from the inspection circuit 200 will be described below.

The opening portion 12q of the second insulation layer 12, for example, may extend in the x direction. The opening portion 12q is positioned in such a manner as to overlap an area that includes the oxide semiconductor layers 5Q of the multiple inspection TFTs 10Q, when viewed in the direction normal to the substrate 1. In this case, a portion that overlaps each oxide semiconductor layer 5Q with the first insulation layer 11 in between, of the second inspection gate wiring line 22 functions as the back gate electrode BG.

In a configuration that is illustrated in FIG. 9, a gap distance between two neighboring inspection TFTs 10Q is provided in such a manner that a distance between the opening portions 12q is equal to or greater than a given width. In contrast, in an example that is illustrated in FIG. 11, one opening portion 12q is provided for multiple inspection TFTs 10Q. Because of this, a distance d between the inspection TFTs 10Q can be shorter than in the configuration that is illustrated in FIG. 9. Therefore, an area that is required for the inspection circuit 200 can be further reduced.

Second Modification Example

Figure 12:
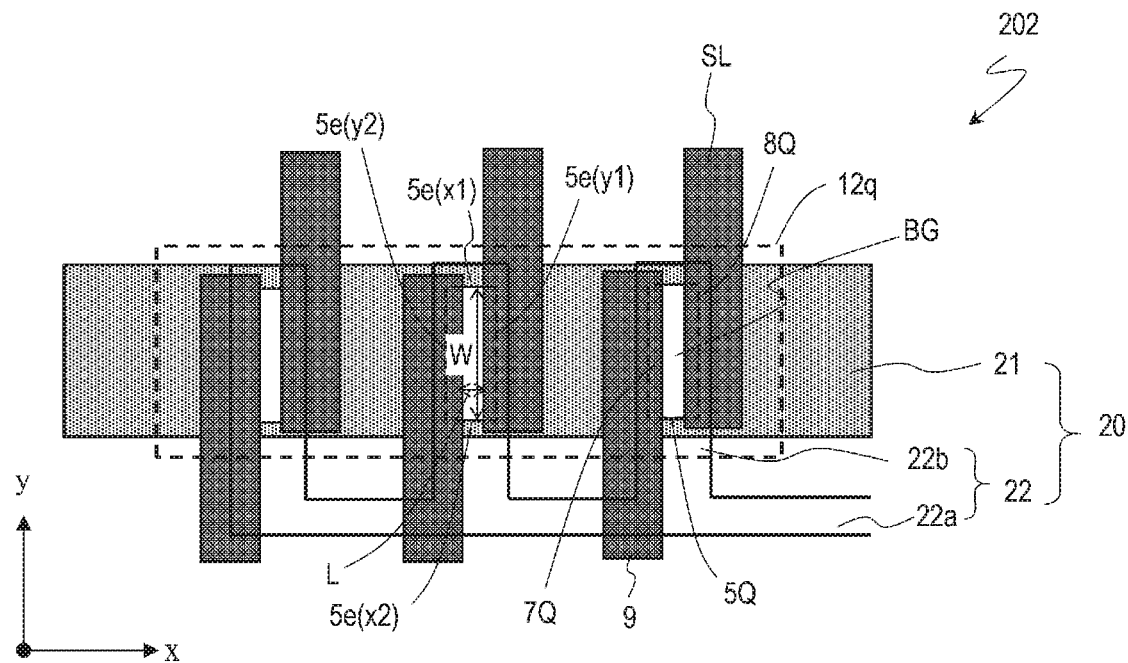
FIG. 12 is a plan view illustrating an inspection circuit 202 of a second modification example in the first embodiment.

FIG. 12 is a plan view illustrating the inspection circuit of a second modification example in the present embodiment.

In an inspection circuit 202 that is the second modification example, the source electrode 7Q and the drain electrode 8Q are arranged in such a manner that a channel is formed within the oxide semiconductor layer 5Q, along the direction (here, the x direction) of the arrangement of the inspection TFTs 10Q when viewed in the direction normal to the substrate 1. Furthermore, the second inspection gate wiring line 22 has a comb structure. A structure other than this structure is the same as that of the inspection circuit 201 that is the first modification example which is illustrated in FIG. 11. A difference from the inspection circuit 201 will be described in more detail below.

In the second modification example, the source bus line SL extends in such a manner as to overlap the edge 5e(y1) that extends in the y direction of the oxide semiconductor layer 5Q, when viewed in the direction normal to the substrate 1, and comes into contact with the oxide semiconductor layer 5Q, in the vicinity of the edge 5e(y1). Therefore, a drain contact area is positioned in a portion that is positioned toward the edge 5e(y1), of the oxide semiconductor layer 5Q. On the other hand, the connection wiring line 9 extends in such a manner as to overlap the edge 5e(y2) that faces the edge 5e(y1) of the oxide semiconductor layer 5Q, and comes into contact with the oxide semiconductor layer 5Q, in the edge 5e(y2). Therefore, a source contact area is positioned a portion that is positioned toward the edge 5e(y2), of the oxide semiconductor layer 5Q. In this configuration, a channel length direction of the inspection TFT 10Q is in the x direction. Furthermore, in a case where the source contact area and the drain contact area are formed along lengthwise directions of the edges 5e(y1) and 5e(y2), a width in the y direction, of the oxide semiconductor layer 5Q is the channel width W.

In the same manner as in the first modification example, the first inspection gate wiring line 21 extends in the x direction in such a manner as to overlap, at least in part, the oxide semiconductor layer 5P when viewed in the direction normal to the substrate 1. On the other hand, the second inspection gate wiring line 22 includes a trunk portion 22a that extends in the x direction when viewed in the direction normal to the substrate 1, and multiple protrusion portions 22b that protrude from the trunk portion. In the present specification, this wiring structure is referred to as "comb structure". Each protrusion portion 22b extends in such a manner as to overlap, at least in part, the corresponding oxide semiconductor layer 5Q. A portion that overlaps the oxide semiconductor layer 5Q, of the protrusion portion 22b functions as the back gate electrode BG.

It is preferable that, because a larger amount of electric current (electric current with which one or multiple pixels in the source bus line SL are charged) flows through the inspection TFT 10Q than the pixel TFT 10P, the source electrode 7Q and the drain electrode 8Q are arranged in such a manner that the channel width can be much more increased. In the inspection circuit 201 that is illustrated in FIG. 11, the oxide semiconductor layer 5Q, the source electrode 7Q, and the drain electrode 8Q are arranged in such a manner that a channel is formed in the y direction within the oxide semiconductor layer 5Q. In order to increase the channel width W, when widths of the source electrode 7Q and the drain electrode 8Q are increased, there occurs a need to increase a distance d between neighboring inspection TFTs 10Q, and there is a concern that a width of an inspection TFT formation area in the inspection circuit 200 will be increased. On the other hand, in the inspection circuit 202 that illustrated in FIG. 12, the oxide semiconductor layer 5Q, the source electrode 7Q, and the drain electrode 8Q are arranged in such a manner that a channel is formed along the x direction that is the direction of the arrangement of the inspection TFTs 10Q. The channel width W is determined by a distance by which the source electrode 7Q and the drain electrode 8Q extend in the y direction on the oxide semiconductor layer 5Q. For this reason, while the increase in the width of the inspection TFT formation area is suppressed, it is possible that the channel width W is further increased.

Furthermore, in the inspection circuit 202, the second inspection gate wiring line 22 has the comb structure. For this reason, while an increase in an overlap capacity of the second inspection gate wiring line 22, the source electrode 7Q, and the drain electrode 8Q is suppressed, it is possible that the channel width is increased.

It is noted that if at least one of the first inspection gate wiring line 21 and the second inspection gate wiring line 22 has the comb structure, the same effect as described above is obtained. For example, the second inspection gate wiring line 22 may extend in the x direction, crossing multiple oxide semiconductor layers 5Q when viewed in the direction normal to the substrate 1, and the first inspection gate wiring line 21 has the comb structure. Alternatively, both the first inspection gate wiring line 21 and the second inspection gate wiring line 22 may have the comb structure.

The configuration and the operation of the inspection circuit are not limited to those described above. It is possible that various changes are made to the inspection circuit. The inspection circuit is disclosed in Japanese Unexamined Patent Application Publication Nos. 2011-154161 and 2014-153493 and the like. For reference, the entire contents of Japanese Unexamined Patent Application Publication Nos. 2011-154161 and 2014-153493 are incorporated in the present specification by reference.

Other Modification Examples

Figure 13:
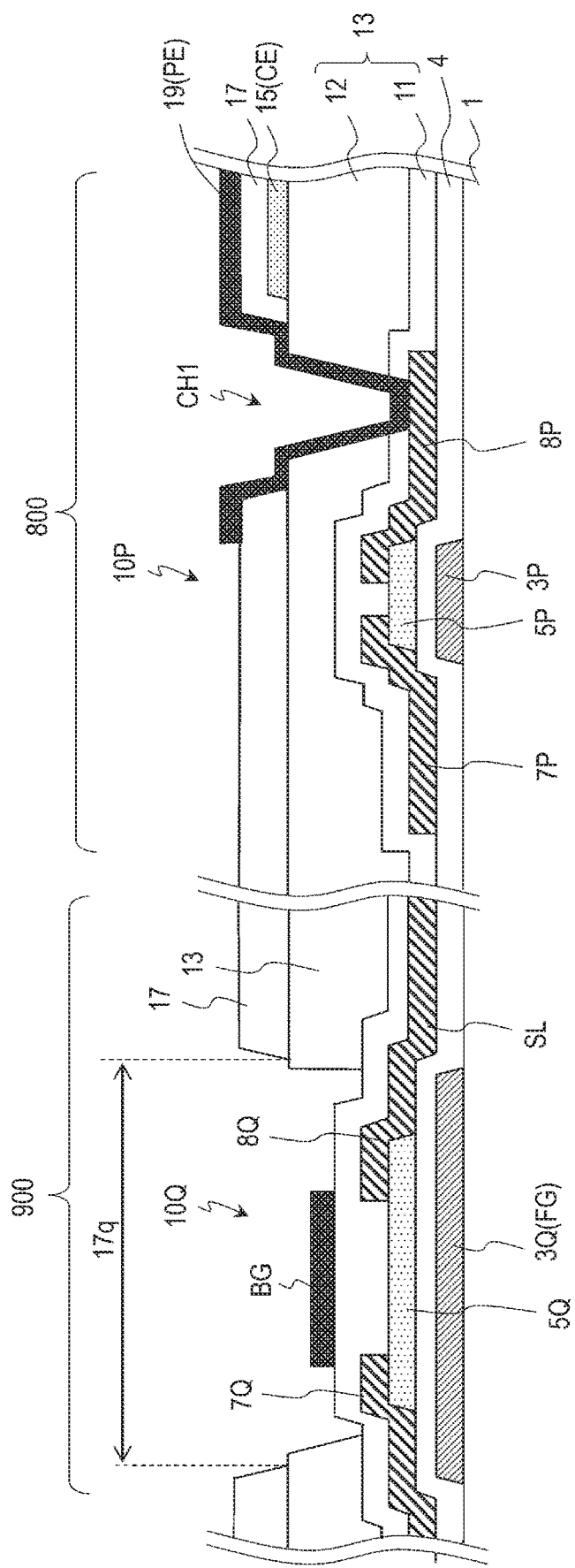
FIG. 13 is a schematic cross-sectional diagram illustrating another inspection TFT 10Q and another pixel TFT 10P in the active matrix substrate 1001.
Figure 14:
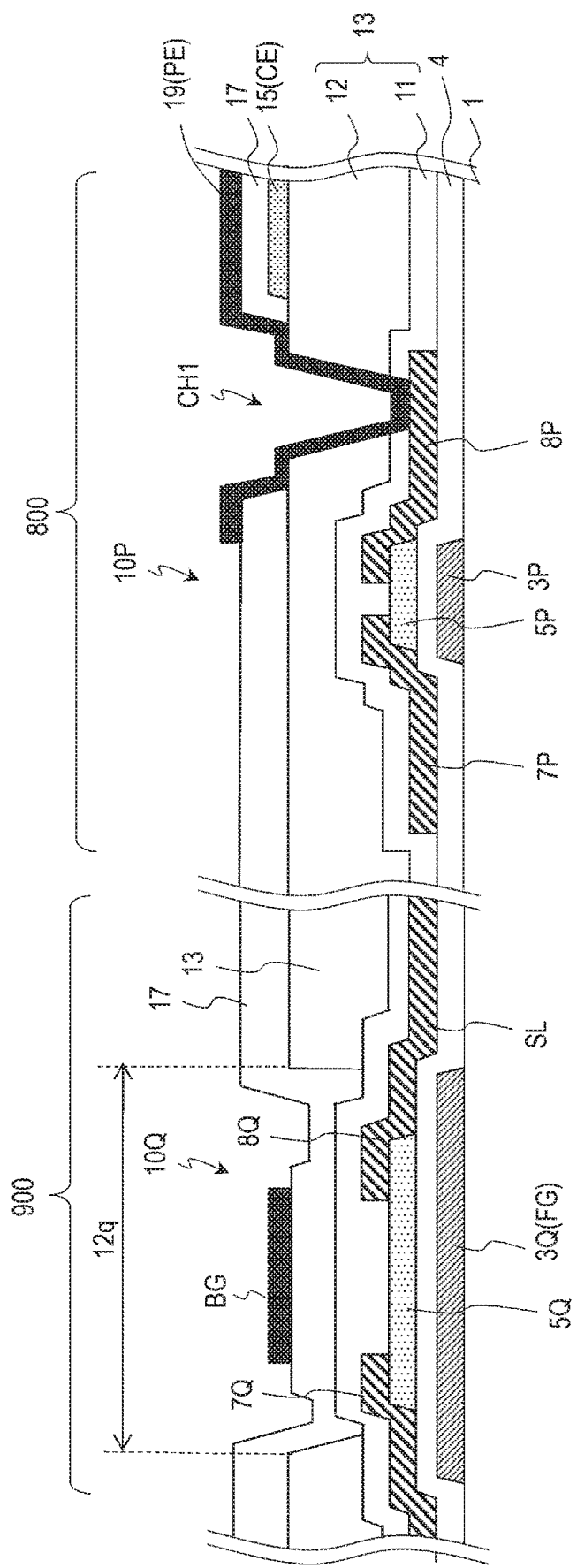
FIG. 14 is a schematic cross-sectional diagram illustrating still another inspection TFT 10Q and still another pixel TFT 10P in the active matrix substrate 1001.
Figure 15:
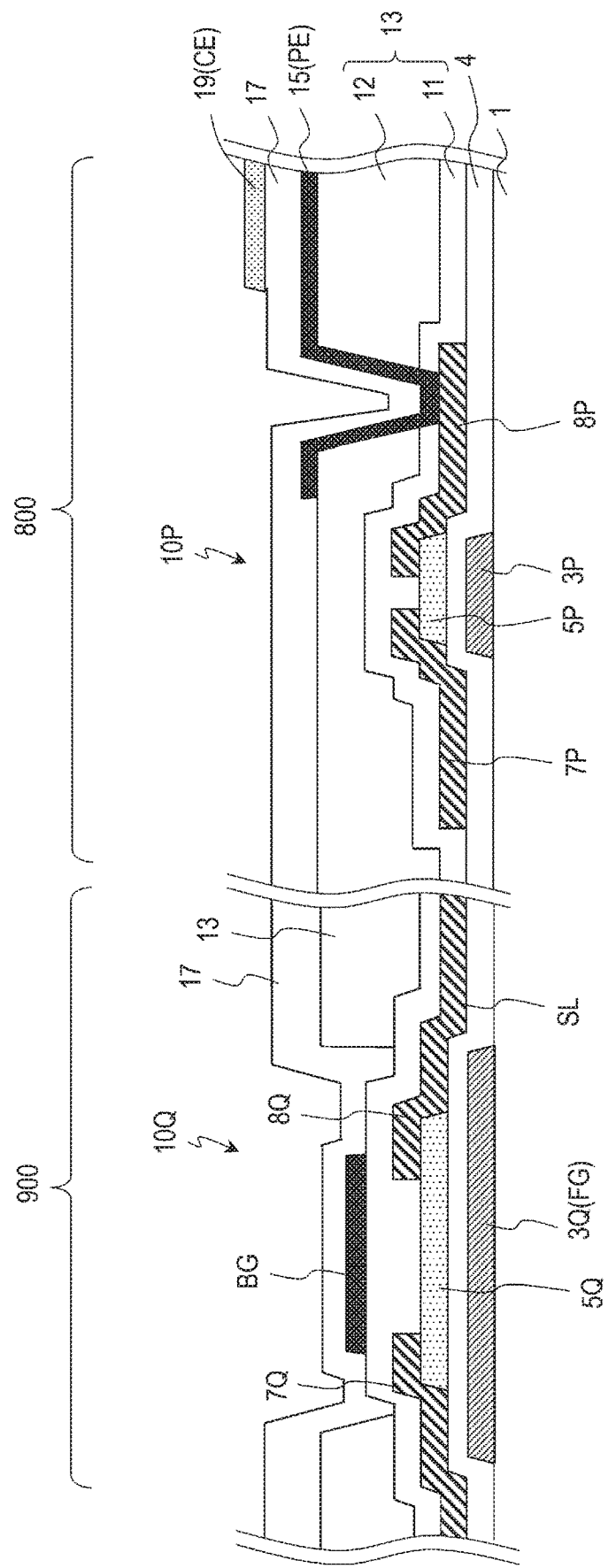
FIG. 15 is a schematic cross-sectional diagram illustrating still another inspection TFT 10Q and still another pixel TFT 10P in the active matrix substrate 1001.

FIGS. 13 to 15 are cross-sectional diagrams each illustrating another example of the inspection TFT 10Q and the pixel TFT 10P.

As illustrated in FIGS. 13 and 14, the back gate electrode BG may be formed from the same transparent conductive film as the upper transparent electrode.

In an example that is illustrated in FIG. 13, the second inspection gate wiring line 22 and the back gate electrode BG are formed from the same transparent conductive film as the upper transparent electrode 19 (here, the pixel electrode PE). The back gate electrode BG is positioned within an opening portion 17q in the second insulation layer 12 and the dielectric layer 17 and is in contact with the upper surface of the first insulation layer 11. Therefore, the first insulation layer 11 functions as a gate insulation layer that is toward a back gate.

As illustrated in FIG. 14, the dielectric layer 17 and the back gate electrode BG may be arranged within an opening portion 12p in the second insulation layer 12. In this case, within the opening portion 12p in the second insulation layer 12, the dielectric layer 17 is in contact with the upper surface of the first insulation layer 11, and the back gate electrode BG is in contact with an upper surface of the dielectric layer 17. Therefore, the first insulation layer 11 and the dielectric layer 17 function as the gate insulation layer that is toward the back gate.

Alternatively, as illustrated in FIG. 15, the lower transparent electrode 15 is the pixel electrode PE, and the upper transparent electrode 19 is the common electrode CE. In FIG. 15, the back gate electrode BG is formed within the same layer as the lower transparent electrode 15, but the back gate electrode BG may be provided within the same layer as the upper transparent electrode 19.

A structure of the inspection circuit 200 is not limited to structures that are illustrated in FIGS. 9, 11, and 12. For example, the first inspection gate wiring line 21 and the inspection wiring line 30 may be formed within the source metal layer. In this case, the gate electrode 3Q, for example, is connected to the first inspection gate wiring line 21, within an opening portion that is provided in the gate insulation layer 4. Furthermore, the source electrode 7Q and the connection wiring line 9 can be formed in a manner that is integrally combined with one inspection wiring line 30.

Furthermore, the second inspection gate wiring line 22 may be formed in a manner that is integrally combined with the back gate electrode BG. For example, the second inspection gate wiring line 22 may be formed within the gate metal layer or the source metal layer, and the back gate electrode BG may be connected by a contact portion to the second inspection gate wiring line 22. Even in this case, one common back gate electrode BG may be used for multiple inspection TFTs 10Q.

Moreover, one common wiring line that is connected to both the back gate electrode BG and the front gate electrode FG of each of the multiple inspection TFTs 10Q may be provided as the inspection gate wiring lines 20.

<Method of Manufacturing a Semiconductor Device>

An example of a method of manufacturing the active matrix substrate 1001 is described with reference again to FIG. 10.

First, a circuit that includes the inspection TFT 10Q, the pixel TFT 10P, the gate bus line GL, the source bus line SL, and the like are formed on the substrate 1 using a known method.

Specifically, a gate interconnection layer that includes the gate bus line GL and the gate electrodes 3P and 3Q is formed on the substrate 1. As the substrate, for example, a glass substrate, a silicon substrate, a plastic substrate (a resin substrate) that has a heat-resisting property, or the like can be used. To obtain the gate interconnection layer, a gate conductive film (the thickness thereof is equal to or greater than 50 nm and is equal to or smaller than 500 nm) is formed on the substrate 1 using a sputtering method and this gate conductive film is patterned. As the gate conductive film, a film that contains a metal, such as aluminum (Al), tungsten (W), molybdenum (Mo), tantalum (Ta), chrome (Cr), titanium (Ti), or copper (Cu), an alloy of these, or metal nitride of these can be suitably used. Furthermore, a stacked film that results from stacking these films may be used.

Subsequently, using a CVD method or the like, a gate interconnection layer (the thickness thereof, for example, is equal to or greater than 200 nm and equal to or smaller than 500 nm) 4 is formed in such a manner as to cover the gate insulation layer. As the gate insulation layer 4, a silicon oxide (SiOx) layer, a silicon nitride (SiNx) layer, a silicon-oxide-nitride (SiOxNy; x>Y) layer, a silicon nitride oxide (SiNxOy; x>y) layer, or the like can be suitably used. The gate insulation layer 4 may have a multi-layered structure.

Subsequently, an oxide semiconductor film is formed on the gate insulation layer 4 and an oxide semiconductor film (the thickness thereof, for example, is equal to or greater than 30 nm and is equal to or smaller than 200 nm) is patterned, and thus the oxide semiconductor layer 5Q that is an activation layer of an inspection TFT and the oxide semiconductor layer 5P that is an activation layer of a pixel TFT are formed. The oxide semiconductor film may have a multi-layered structure.

In a case where a TFT that has the etch stop structure is formed, at this point, a protection layer (the thickness thereof, for example, is equal to or greater than 30 nm and is equal to or smaller than 200 nm) that is an etch stop layer of a TFT (a channel protection layer) is formed. As the protection layer, a silicon oxide (SiOx) layer, a silicon nitride (SiNx) layer, a silicon-oxide-nitride (SiOxNy; x>y) layer, a silicon nitride oxide (SiNxOy; x>y) layer, or the like can be suitably used. The protection layer may have a multi-layered structure. Subsequently, patterning of the protection layer is performed, and a source opening portion through which a source contact area of each of the oxide semiconductor layers 5Q and 5P is exposed, and a drain opening portion through which a drain contact area is exposed are formed.

Thereafter, a source conductive film (the thickness thereof, for example, is equal to or greater than 50 nm and is equal to smaller than 500 nm) is formed on the substrate 1, and this source conductive film is patterned. Thus, the source bus line SL, and the source electrodes 7Q and 7P and the drain electrodes 8Q and 8P that are in contact with the oxide semiconductor layers 5Q and 5P, respectively, are formed, and the inspection TFT 10Q and the pixel TFT 10P are obtained. As the source conductive film, a film that contains a metal, such as aluminum (Al), tungsten (W), molybdenum (Mo), tantalum (Ta), chrome (Cr), titanium (Ti), or copper (Cu), an alloy of these, or metal nitride of these can be suitably used. Furthermore, a stacked film that results from stacking these films may be used.

Subsequently, an inorganic insulation layer (the thickness thereof, for example, ranges from 100 nm to 500 nm, preferably, from 200 nm to 500 nm) is formed as the first insulation layer 11, in such a manner as to cover the inspection TFT 10Q and the pixel TFT 10P, for example, using a CVD method.

As the first insulation layer 11, an inorganic insulation film (a passivation film), such as a silicon oxide (SiOx) film, a silicon nitride (SiNx) film, a silicon-oxide-nitride (SiOxNy; x>y) film, or a silicon nitride oxide (SiNxOy; x>y) film, can be used. The first insulation layer 11 may have a multi-layered structure.

Subsequently, an organic insulation layer (the thickness thereof, for example, ranges from 1 μm to 3 μm, preferably, from 2 μm to 3 μm) is formed as the second insulation layer 12 on the first insulation layer 11. An organic insulation layer that contains photosensitive resin material may be formed as the second insulation layer 12. Subsequently, patterning of the second insulation layer 12 is performed with a photolithography process. Accordingly, the opening portion 12q through which a portion that is positioned on the inspection TFT 10Q, of the first insulation layer 11 is exposed, and the opening portion 12p through which a portion that is positioned on the drain electrode 8P of the pixel TFT 10P, of the first insulation layer 11 is exposed are formed.

Subsequently, a first transparent conductive film (the thickness thereof, for example, is equal to or greater than 50 nm and is equal to or smaller than 200 nm) is formed on the second insulation layer 12 and within the opening portions 12q and 12q. Subsequently, the first transparent conductive film is patterned, and thus the lower transparent electrode 15 that is the common electrode CE, the back gate electrode BG, and the second inspection gate wiring line 22 are formed. As the first transparent conductive film, for example, an indium and tin oxide (ITO) film, an indium and zinc oxide (In—Zn—O-based oxide) film, a zinc oxide film (ZnO film), or the like can be used.

Subsequently, the dielectric layer 17 may be formed in such a manner as to cover the lower transparent electrode 15. As the dielectric layer 17, a silicon nitride (SiNx) film, a silicon oxide (SiOx) film, a silicon-oxide-nitride (SiOxNy; x>y) film, a silicon nitride oxide (SiNxOy; x>y) film, or the like can be suitably used. In a case where an auxiliary capacity is configured with the lower transparent electrode 15, the dielectric layer 17, and the upper transparent electrode 19, SiNx can be suitably used as the dielectric layer 17 in terms of a dielectric constant and an insulation property. The thickness of the dielectric layer 17, for example, is equal to or greater than 70 nm and is equal to or smaller than 300 nm.

Thereafter, a resist layer that is not illustrated is formed, etching of the dielectric layer 17 and the first insulation layer 11 is performed with the resist layer and the second insulation layer 12 as etching masks, and the pixel contact hole CH1 is formed.

Subsequently, a second transparent conductive film is formed on the dielectric layer 17 and within the pixel contact hole CH1, and this second transparent conductive film is patterned. Thus, the upper transparent electrode 19 that is the pixel electrode PE is obtained. The suitable material and thickness of the second transparent conductive film may be the same as those of the first transparent conductive film. In this manner, the active matrix substrate 1001 is manufactured.

With the method described above, without newly adding a process of providing the back gate electrode BG, TFTs 101 and 201 can be manufactured using a process of manufacturing a TFT substrate for a display device in the related art.

<TFT Structure>

The structures of the pixel TFT 10P and the inspection TFT 10Q are not limited to the examples described above. The pixel TFT 10P and the inspection TFT 10Q may have a top contact structure in which source and drain electrodes are in contact with an upper surface of a semiconductor layer, and may have a bottom contact structure in which the source and drain electrodes are in contact with a lower surface of the semiconductor layer. Furthermore, the pixel TFT 10P and the inspection TFT 10Q each may have the channel etch structure and may have the etch stop structure.

In an etch stop type TFT, an etch stop layer is formed on a channel region. End portion lower surfaces that are toward the channel, of the source and drain electrodes, for example, are positioned on the etch stop layer. For example, the etch stop layer that covers a portion that is a channel region, of the oxide semiconductor layer is formed, and then a conductive film for the source and drain electrodes is formed on the oxide semiconductor layer and the etch stop layer and separation of a source and a drain is performed. Thus, the etch stop type TFT is formed.

In the channel etch type TFT, as illustrated in FIG. 10, the end portion lower surfaces that are toward the channel, of the source electrode and the drain electrode, are arranged in such a manner as to be brought into contact with an upper surface of the oxide semiconductor layer, without the etch stop layer being formed on the channel region. For example, the conductive film for the source and drain electrodes is formed on the oxide semiconductor layer and the separation of the source and the drain is performed. Thus, the channel etch type TFT is formed. In some cases, in a process of separating the source and the drain, a surface portion of the channel region is etched.

<Oxide Semiconductor>

The oxide semiconductor that is included in the oxide semiconductor layers 5P and 5Q may be an amorphous oxide semiconductor and may be a crystalline oxide semiconductor that has a crystalline portion. As the crystalline oxide semiconductor, a polycrystalline oxide semiconductor, a micro-crystalline oxide semiconductor, a crystalline oxide semiconductor in which a c-axis aligns approximately vertically with a layer surface, or the like is given.

The oxide semiconductor layers 5P and 5Q each may have a multi-layered structure in which two or more layers are involved. In a case where the oxide semiconductor layers 5P and 5Q each have a multi-layered structure, the oxide semiconductor layers 5P and 5Q each may include a non-crystalline oxide semiconductor layer and a crystalline oxide semiconductor layer. Alternatively, multiple crystalline oxide semiconductor layers that have different crystalline structures may be included. Furthermore, multiple non-crystalline oxide semiconductor layers may be included. In a case where the oxide semiconductor layers 5P and 5Q each have a two-layered structure in which an upper layer and a lower layer are included, it is preferable that an energy gap of the oxide semiconductor that is included in the upper layer is set to be greater than an energy gap of the oxide semiconductor that is included in the lower layer. However, in a case where a difference in the energy gap between the upper and lower layers is comparatively small, the energy gap of the oxide semiconductor in the lower layer may be set to be greater than the energy gap of the oxide semiconductor in the upper layer.

Materials and structures of the non-crystalline oxide semiconductor and each of the crystalline oxide semiconductors described above, a film formation method, a configuration of the oxide semiconductor layer that has a multi-layered structure, and the like, for example, are described in Japanese Unexamined Patent Application Publication No. 2014-007399. For reference, the entire contents of Japanese Unexamined Patent Application Publication No. 2014-007399 is incorporated in the present specification by reference.

The oxide semiconductor layers 5P and 5Q each may include, for example, at least one type of metal element among In, Ga, and Zn. In the present embodiment, the oxide semiconductor layers 5P and 5Q each contain, for example, an In—Ga—Zn—O-based semiconductor (for example, oxide indium gallium zinc). The In—Ga—Zn—O-based semiconductor here is a ternary oxide material that consists of Indium (In), Gallium (Ga), and Zinc (Zn). A ratio (a composition ratio) among In, Ga, and Zn is not particularly limited. Examples of the ratio include In:Ga:Zn=2:2:1, In:Ga:Zn=1:1:1, In:Ga:Zn=1:1:2, and the like. The oxide semiconductor layers 5P and 5Q each can be formed from an oxide semiconductor film that contains an In—Ga—Zn—O-based semiconductor.

The In—Ga—Zn—O-based semiconductor may be amorphous and may be crystalline. A crystalline in-Ga—Zn—O-based semiconductor in which a c-axis aligns approximately vertically with a layer surface is preferable as a crystalline In—Ga—Zn—O-based semiconductor.

It is noted that a crystalline structure of the crystalline In—Ga—Zn—O-based semiconductor, for example, is disclosed in Japanese Unexamined Patent Application Publication Nos. 2014-007399, 2012-134475, and 2014-209727, which are described above, and other publications. For reference, the entire contents of Japanese Unexamined Patent Application Publication Nos. 2012-134475 and 2014-209727 are incorporated in the present specification by reference. A TFT that has an In-GA-Zn—O-based semiconductor layer has high mobility (which is more than 20 times higher than that of an a-Si TFT) and a small amount of leak electric current (which is less than one-hundredth of that of the a-Si TFT). Because of this, the TFT is suitably used as a drive TFT (for example, a TFT that is included in a drive circuit which is provided on the same substrate as a display area, in the vicinity of the display area that includes multiple pixels) and a pixel TFT (a TFT that is provided in a pixel).

The oxide semiconductor layers 5P and 5Q each may contain any other oxide semiconductor instead of the In—Ga—Zn—O-based semiconductor. For example, an In—Sn—Zn—O-based semiconductor (for example, $In_2O_3$—$SnO_2$—$ZnO$; InSnZnO) may be contained. The In—Sn—Zn—O-based semiconductor is a ternary oxide material that consists of Indium (In), Tin (Sn), and Zinc (Zn). Alternatively, the oxide semiconductor layers 5P and 5Q each may contain an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb-0-based semiconductor, Cadmium oxide (CdO), a Mg—Zn—O-based semiconductor, an In—Ga—Sn—O-based semiconductor, an In—Ga-0-based semiconductor, a Zr—In—Zn—O-based semiconductor, a Hf—In—Zn—O-based semiconductor, an Al—Ga—Zn—O-based semiconductor, a Ga—Zn—O-based semiconductor, or the like.

Second Embodiment

A semiconductor device according to a second embodiment of the present invention will be described below with reference to the drawings. The semiconductor device according to the present embodiment is an active matrix substrate that includes an oxide semiconductor TFT and a crystalline silicon TFT that are formed on the same substrate.

In the present embodiment, as the pixel TFT, for example, the oxide semiconductor TFT of which an activation layer is an In—Ga—Zn—O-based semiconductor film is used. It is possible that the pixel TFT 10p which is described above with reference to FIG. 10 finds application as the pixel TFT.

A portion (for example, a gate driver circuit) of a peripheral drive circuit is integrally (monolithically) formed, as the pixel TFT, on the same substrate. A remaining portion (for example, a source driver circuit) of the peripheral drive circuit, for example, is mounted on a substrate with COG packaging.

The peripheral drive circuit is provided in a non-display area (a frame area). As a TFT (a circuit TFT) that constitutes the peripheral drive circuit, for example, a crystalline silicon TFT of which an activation layer is a polycrystalline silicon film is used. In this manner, when the oxide semiconductor TFT is used as the pixel TFT and when the crystalline silicon TFT is used as the circuit TFT, it is possible that power consumption is reduced in the display area and it is possible that the frame area is decreased.

In the present embodiment, in the same manner as in the embodiment described above, the inspection TFT is positioned in the semiconductor chip mounting area, and thus the frame area can be further reduced.

As the inspection TFT, the back gate structure TFT may be used, and any one of the crystalline silicon TFT and the oxide semiconductor TFT may be used. When as the inspection TFT, the oxide semiconductor TFT is used, there is an advantage in that off-leak electric current can be suppressed to such an extent that the off-leak electric current is decreased. It is possible that the inspection TFT 10Q which described above with reference to FIG. 10 finds application as the inspection TFT.

As will be described below, in a case where the crystalline silicon TFT that has the top gate structure, as the circuit TFT, and the oxide semiconductor TFT that has the bottom gate structure, as the pixel TFT are formed, it is preferable that the oxide semiconductor TFT is used as the inspection TFT. The inspection TFT may have the same structure as the pixel TFT except that the inspection TFT has the back gate electrode over the oxide semiconductor layer. Accordingly, the inspection TFT that has the back gate structure can be manufactured without increasing the number of manufacturing processes.

Figure 16:
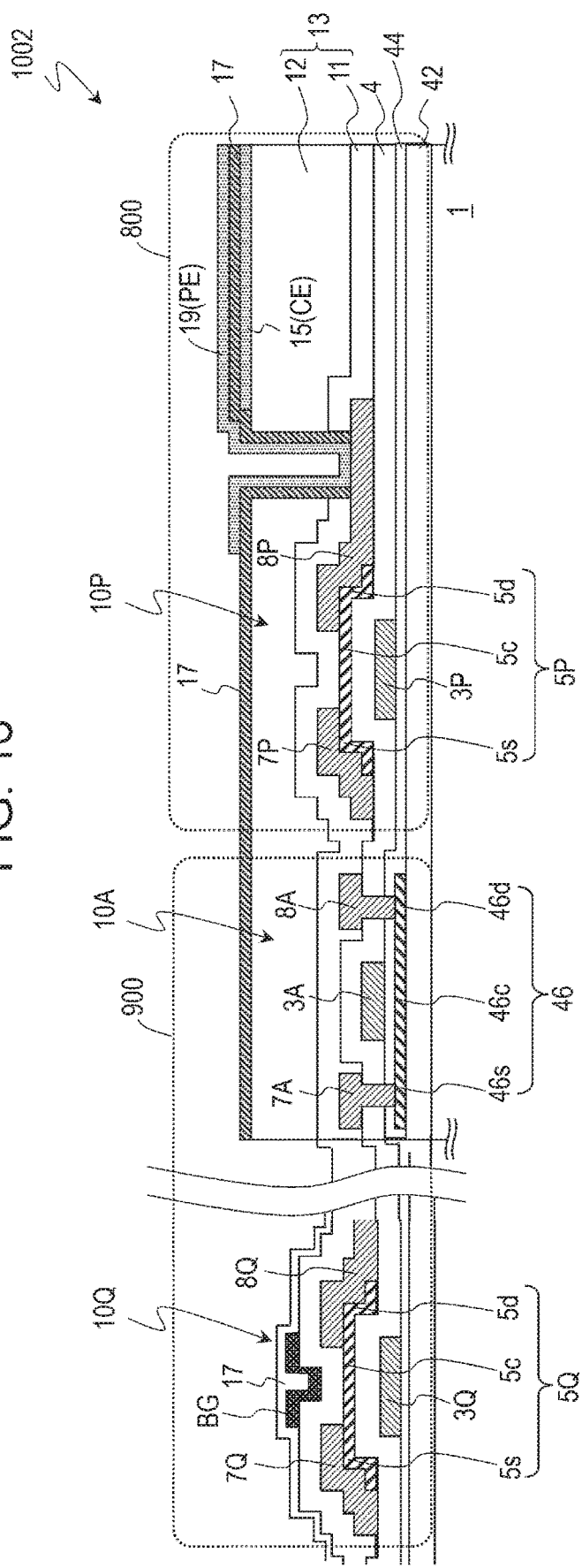
FIG. 16 is a cross-sectional diagram illustrating an inspection TFT 10Q, a circuit TFT 10A, and a pixel TFT 10P in an active matrix substrate 1002 according to a second embodiment.

FIG. 16 is a cross-sectional diagram illustrating the inspection TFT 10Q, a circuit TFT 10A, and the pixel TFT 10P in an active matrix substrate 1002 according to the present embodiment.

In this example, the inspection TFT 10Q is an oxide semiconductor TFT that has the back gate structure, the circuit TFT 10A is a crystalline silicon TFT that has the top gate structure, and the pixel TFT 10P is an oxide semiconductor TFT that has the bottom gate structure.

A planar structure of the active matrix substrate 1002 is the same as the structure that is described with reference to FIG. 1, and thus a description thereof is omitted.

In the active matrix substrate 1002, the pixel TFT 10P is formed as the pixel TFT in each pixel in the display area, and the circuit TFT 10A is formed as the circuit TFT in an area in which a drive circuit is formed. Furthermore, the inspection TFT 10Q is formed in the semiconductor chip mounting area.

The active matrix substrate 1002 includes the substrate 1, a base film 42 that is formed in a surface of the substrate 1, the circuit TFT 10A that is formed on the base film 42, and the pixel TFT 10P that is formed on the base film 42. The circuit TFT 10A is a crystalline silicon TFT that has an activation region which primarily contains crystalline silicon. The pixel TFT 10P is an oxide semiconductor TFT that has an activation region which primarily contains an oxide semiconductor. The circuit TFT 10A and the pixel TFT 10P are integrally built on the substrate 1. The "activation region" here refers to an area on which a channel is formed, of the semiconductor layer that is the activation layer of the TFT, and is also called "channel region".

The circuit TFT 10A has a crystalline silicon semiconductor layer (for example, a low-temperature polysilicon layer) 46 that is formed on the base film 42, a lower insulation layer 44 that covers the crystalline silicon semiconductor layer 46, and the gate electrode 3A that is provided on the lower insulation layer 44. A portion that is positioned between the crystalline silicon semiconductor layer 46 and the gate electrode 3A, of the lower insulation layer 44 functions as a gate insulation film of the circuit TFT 10A. The crystalline silicon semiconductor layer 46 has a region (an activation region) 46c on which a channel is formed and has a source region 46s and a drain region 46d that are positioned to both the sides, respectively, of the activation region. In this example, a portion that overlaps the gate electrode 3A with the lower insulation layer 44 in between, of the crystalline silicon semiconductor layer 46 is the activation region 46c. The circuit TFT 10A further has a source electrode 7A and a drain electrode 8A that are connected to the source region 46s and the drain region 46d, respectively. The source and drain electrodes 7A and 8A may be provided on an inter-layer insulation film (here, the gate insulation layer 4) that covers the gate electrode 3A and the crystalline silicon semiconductor layer 46 and may be connected to the crystalline silicon semiconductor layer 46 within a contact hole that is formed in the inter-layer insulation film.

The pixel TFT 10P and the inspection TFT 10Q have the gate electrodes 3P and 3Q that are provided on the base film 42, the gate insulation layers 4 that covers, respectively, the gate electrodes 3P and 3Q, and the oxide semiconductor layers 5P and 5Q that are positioned, respectively, on the gate insulation layers 4, respectively. As illustrated, the lower insulation layer 44 that is the gate insulation film of the circuit TFT 10A may extend up to an area in which the pixel TFT 10P and the inspection TFT 10Q are set to be formed. In this case, the oxide semiconductor layers 5P and 5Q each may be formed on the lower insulation layer 44. Portions that are positioned, respectively, between the gate electrode 3P and the oxide semiconductor layer 5P and between the gate electrode 3Q and the oxide semiconductor layer 5Q, of the gate insulation layer 4 function as gate insulation films, respectively, of the pixel TFT 10P and the inspection TFT 10Q. The oxide semiconductor layers 5P and 5Q each have a region (the activation region) 17c on which a channel is formed, and the source contact area 5s and a drain contact area 5d that are positioned on both the sides, respectively, of the activation region. In this example, portions that overlap, respectively, the gate electrodes 3P and 3Q, of the oxide semiconductor layers 5P and 5Q, respectively, with the gate insulation layer 4 in between are activation regions 5c, respectively. Furthermore, the pixel TFT 10P and the inspection TFT 10Q further have the source electrodes 7P and 7Q and the drain electrodes 8P and 8Q that are connected, respectively, to the source contact area 5s and the drain contact area 5d, respectively. Moreover, it is also possible that the base film 42 is not provided on the substrate 1.

The circuit TFT 10A and the pixel TFT 10P each are covered with the first insulation layer (a passivation film) 11 and the second insulation layer (a flattening film) 12. In the pixel TFT 10P, the gate electrode 3P is connected to a gate bus line (not illustrated), the source electrode 7P to a source bus line (not illustrated), and the drain electrode 8P to the pixel electrode 19. In this example, the drain electrode 8P is connected to the corresponding pixel electrode 19 within an opening portion that is formed in the first insulation layer 11 and the second insulation layer 12. A video signal is supplied to the source electrode 7P through the source bus line, and necessary electric potential is written to the pixel electrode 19 based on a gate signal from the gate bus line.

It is noted that, as illustrated, the lower transparent electrode 15 may be formed as a common electrode on the second insulation layer 12, and the dielectric layer 17 may be formed between the lower transparent electrode (the common electrode) 15 and the pixel electrode 19. In this case, an opening in the shape of a slit may be provided in the pixel electrode 19. This active matrix substrate 1002, for example, can find application in the display device that operates in the FFS mode. In this example, an electric field is generated that is expressed as a line of electric force which gets out of the pixel electrode 19, passes through a liquid crystal layer (not illustrated) and further through the opening in the shape of a slit in the pixel electrode 19, and gets to the common electrode 15. This electric field has a component in the horizontal direction with respect to the liquid crystal layer. As a result, the electric field in the horizontal direction can be applied to the liquid crystal layer. In a horizontal-direction electric field method, a liquid crystal molecule does not rise up from the substrate. Because of this, there is an advantage in that the transverse electric field method can realize a wider viewing angle than a vertical-direction electric field method.

The inspection TFT 10Q is covered with the first insulation layer 11. The second insulation layer 12 has the opening portion 12q over the inspection TFT 10Q. The back gate electrode BG is provided within the opening portion 12q. The back gate electrode BG is positioned in such a manner as to overlap at least a channel region of the oxide semiconductor layer 5Q with the first insulation layer 11 in between. As described above, the back gate electrode BG may be formed from the same transparent conductive film as the pixel electrode 19. Alternatively, the back gate electrode BG may be formed from the same transparent conductive film as the common electrode.

In an example that is illustrated, the circuit TFT 10A has a top gate structure in which the crystalline silicon semiconductor layer 46 is positioned between the gate electrode 3A and the substrate 1 (the base film 42). On the other hand, the pixel TFT 10P has a bottom gate structure in which the gate electrode 3P is positioned between the oxide semiconductor layer 5P and the substrate 1 (the base film 42). By employing this structure, it is possible that the number of manufacturing processes or an increase in manufacturing cost is more effectively suppressed when two types of thin film transistors (the circuit TFT 10A and the pixel TFT 10P) are integrally formed on the same substrate 1.

TFT structure of the circuit TFT 10A and the pixel TFT 10P are not limited to those described above. For example, the circuit TFT 10A and the pixel TFT 10P may have the TFT structure. Alternatively, the circuit TFT 10A may have the bottom gate structure, and the pixel TFT 10P may have the top gate structure. Furthermore, in the case of the bottom gate structure, a channel etch type may be available and an etch stop type may be available.

The gate insulation layer 4 that is a gate insulation film of the pixel TFT 10P may extend up to an area in which the circuit TFT 10A is formed and may function as an inter-layer insulation film that covers the gate electrode 3A and the crystalline silicon semiconductor layer 46 of the circuit TFT 10A. In a case where, in this manner, an inter-layer insulation film of the circuit TFT 10A and a gate insulation film of the pixel TFT 10P are formed within the same layer (the gate insulation layer 4), the gate insulation layer 4 may have the multi-layered structure. For example, the gate insulation layer 4 may have a multi-layered structure in which a layer (for example, a silicon nitride layer) with a hydrogen donation property of possibly supplying hydrogen and a layer (for example, a silicon oxide layer) with an oxygen donation property of possibly supplying oxygen, which is positioned on the layer with the hydrogen donation property of possibly supplying hydrogen, are included.

The gate electrode 3A of the circuit TFT 10A, the gate electrode 3P of the pixel TFT 10P, and the gate electrode 3Q of the inspection TFT 10Q may be formed within the same layer. Furthermore, the source and drain electrodes 7A and 8A of the circuit TFT 10A, the source and drain electrodes 7P and 8P of the pixel TFT 10P, and the source and drain electrodes 7Q and 8Q of the inspection TFT 10Q may be formed within the same layer. The expression "electrodes are formed within the same layer" means that electrodes are formed using the same film (the conductive film). Accordingly, the increase in the number of manufacturing processes and in the manufacturing cost can be suppressed.

A circuit that includes the circuit TFT 10A may be a circuit other than the gate driver circuit.

Furthermore, as an example, the active matrix substrate of the liquid crystal display device that performs display in a transverse electric field mode such as the FFS mode is described above, but can also find application as an active matrix substrate of a liquid crystal display device that performs display in a vertical electric field mode (for example, a TN mode or a vertical alignment mode) in which a voltage is applied in the direction of the thickness of a liquid crystal layer.

Third Embodiment

In the same manner as the active matrix substrate according to the second embodiment, an active matrix substrate according to a third embodiment includes the oxide semiconductor TFT and the crystalline silicon TFT on the same substrate. The active matrix substrate according to the present embodiment is different from the active matrix substrate according to the second embodiment, in that the inspection circuit further includes another inspection TFT (hereinafter referred to as "second inspection TFT") that is connected in serial to the inspection TFT (hereinafter referred to as "first inspection TFT") which has the back gate structure.

The first inspection TFT is an oxide semiconductor TFT that has the back gate structure, and the second inspection TFT, for example, is a crystalline silicon TFT. As the first inspection TFT, for example, the inspection TFT 10Q that is illustrated in FIG. 10 may be used. The second inspection TFT, for example, may be formed using the same crystalline silicon semiconductor film as the circuit TFT 10A that is illustrated in FIG. 16 and may have the same structure as the circuit TFT 10A.

The second inspection TFT, for example, may be positioned, toward the display area, in the first inspection TFT. Specifically, a drain electrode of the second inspection TFT may be connected to the source bus line SL, a source electrode may be connected to a drain electrode of the first inspection TFT, and a source electrode of the first inspection TFT may be connected to the connection wiring line 9.

In the present embodiment, an inspection source signal is supplied from the connection wiring line 9 to a given source bus line through the first inspection TFT and the second inspection TFT. A front gate electrode of the first inspection TFT is connected to the first inspection gate wiring line 21, and the back gate electrode BG is connected to the second inspection gate wiring line 22. A gate electrode of the second inspection TFT is connected to another inspection gate wiring line. Therefore, the first inspection TFT and the second inspection TFT are controlled individually. At the time of the inspection, the second inspection TFTs may be controlled in such a manner that they all enter an ON state. Alternatively, as will be described below, the second inspection TFTs that are provided on multiple source bus lines which are grouped may be controlled in such a manner that they all enter the ON state in a time-series manner. The second inspection TFT can also be used not only when inspection is performed, but also when the active matrix substrate is normally driven.

One or both of the first inspection TFT and the second inspection TFT are arranged within the semiconductor chip mounting area. For example, only the first inspection TFT that has the back gate structure may be positioned in the semiconductor chip mounting area R, and the second inspection TFT may be positioned between the semiconductor chip mounting area R and the display area.

Subsequently, an example of the active matrix substrate according to the present embodiment is described. An example in which a time division circuit that can be used at the time of the lighting inspection and at the time of the normal driving is configured using the second inspection TFT is described here.

Figure 17:
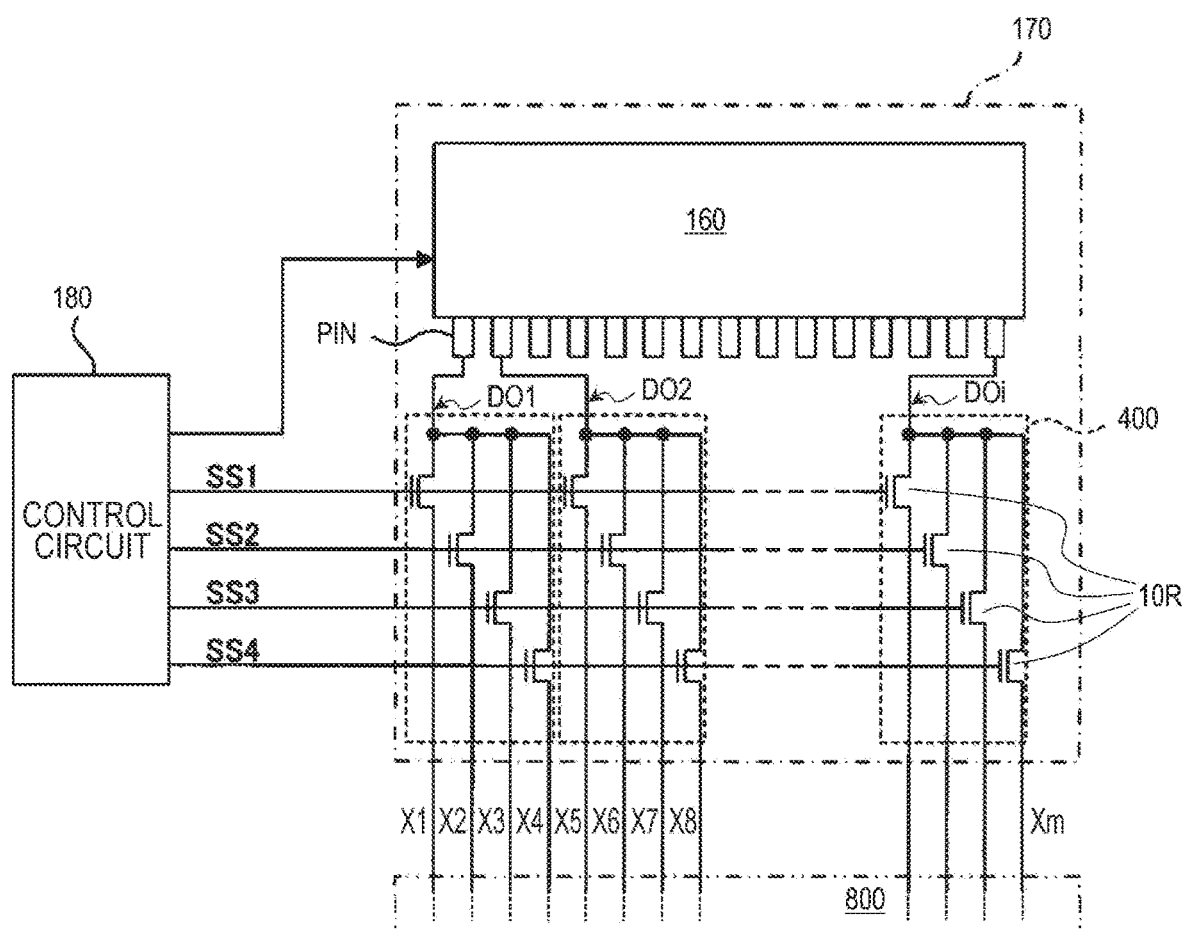
FIG. 17 is a plan view illustrating an example of an active matrix substrate 1003 according to a third embodiment.

FIG. 17 is a plan view illustrating an example of an active matrix substrate 1003 according to the present embodiment.

The active matrix substrate 1003 includes multiple pixel TFTs (not illustrated) in a display area 800. The pixel TFT is an oxide semiconductor TFT. A configuration of the display area 800 is the same as that of the active matrix substrate 1001 that is illustrated in FIG. 1, and thus a description thereof is omitted.

In the non-display area 900, a time division circuit 400 is provided, toward the display area 800, in the first inspection TFT (not illustrated) and the terminal pad ST that are arranged under the semiconductor chip mounting area R. The first inspection TFT is the inspection TFT 10Q describe above. The time division circuit 400 includes multiple second inspection TFTs 10R. The second inspection TFT 10R is a crystalline silicon TFT that has the same structure as the circuit TFT 10A which is illustrated in FIG. 16. An IC driver 160 of the semiconductor chip and the time division circuit 400 are collectively here referred to as a source drive unit 170. A gate driver 140 and the source drive unit 170 are controlled by a control circuit 180.

Any one of the multiple output lines, output lines DO1 to DOi, is connected to each of the output pins PIN of the IC driver 160. Four neighboring data lines (source bus lines SL), data lines X1 to X4, are grouped, and thus a group of the data lines X1 to X4 is associated with one output line DO. The time division circuit 400 is provided, as an output line unit, between the output line DO and the group of the data lines X1 to X4. In each of the time division circuits 400, the second inspection TFT 10R is provided, as a selection switch, in each of the groups of the data lines X1 to X4. Any one of the selection signals SS1 to SS4 is supplied from the control circuit 180 to a gate electrode of the second inspection TFT 10R. The selection signals SS1 to SS4 defines an ON duration of the selection switch within the same group, and is synchronized with a time-series signal output from the driver IC 160. The time division circuit 400 writes (performs time-division driving of) data electric potential that is obtained by time-dividing an output of the output line DO, to multiple data lines, the data lines X1 to X4 in a time-series manner. Accordingly, because a reduction in the number of output pins of the driver IC 160 can be achieved, an increase of a size of an IC that results from the increase in the number of pixels can be suppressed. It is noted that operation of a display device that uses each time division circuit 400, a timing chart of time division driving, and the like, for example, are disclosed in Japanese Unexamined Patent Application Publication Nos. 2008-225036 and 2006-119404 and other publications. For reference, the entire contents of Japanese Unexamined Patent Application Publication Nos. 2008-225036 and 2006-119404 are incorporated in the present specification by reference.

In the active matrix substrate 1003, each of the output lines DO is connected to the first inspection TFT in the semiconductor chip mounting area R. The source electrode of the first inspection TFT, as illustrated in FIG. 2A, is connected to the corresponding inspection terminal.

At the time of the lighting inspection, the second inspection TFTs 10R are controlled in such a manner that they all enter the ON state. In this case, regarding the inspection source signal that is supplied from an inspection terminal to the output line DO through the first inspection TFT, the inspection source signal is supplied all data lines, data lines X1 to X4 in the same group. Alternatively, at the time of the lighting inspection, the selection signals SS1 to SS4 that are input to the first inspection TFT 10R may be controlled in such a manner that the inspection source signal is supplied to the group of the data lines X1 to X4 in a time-series manner.

The active matrix substrates according to the first to third embodiments described above can find application in display devices such as liquid crystal display devices. This display device includes the active matrix substrate according to any one of the embodiments described above, the semiconductor chip that is mounted on the active matrix substrate and that constitutes the drive circuit, the counter substrate that is positioned in such a manner as to face the active matrix substrate, and the display medium layer (for example, the liquid crystal layer) that is provided between the active matrix substrate and the counter substrate.

INDUSTRIAL APPLICABILITY

The active matrix substrates according to the embodiments of the present invention can find application in display devices, such as liquid crystal display devices, organic electroluminescence (EL) display devices, and inorganic electroluminescence display devices, imaging devices, such as image sensor devices, and various electronic devices, such as image input devices, fingerprint reading devices, and semiconductor memories.

REFERENCE SIGNS LIST

1 SUBSTRATE
3P, 3Q GATE ELECTRODE
4 GATE INSULATION LAYER
5P, 5Q OXIDE SEMICONDUCTOR LAYER
7P, 7Q SOURCE ELECTRODE
8P, 8Q DRAIN ELECTRODE
9 CONNECTION WIRING LINE
10P PIXEL TFT
10Q INSPECTION TFT (FIRST INSPECTION TFT)
10R SECOND INSPECTION TFT
10A CIRCUIT TFT
11 FIRST INSULATION LAYER
12 SECOND INSULATION LAYER
12q OPENING PORTION
13 INTER-LAYER INSULATION LAYER
15 LOWER TRANSPARENT ELECTRODE
17 DIELECTRIC LAYER
19 UPPER TRANSPARENT ELECTRODE
20 INSPECTION GATE WIRING LINE
21 FIRST INSPECTION GATE WIRING LINE
22 SECOND INSPECTION GATE WIRING LINE
30 INSPECTION WIRING LINE
31 FIRST INSPECTION WIRING LINE
32 SECOND INSPECTION WIRING LINE
33 THIRD INSPECTION WIRING LINE
140 GATE DRIVER CIRCUIT
200, 201, 202 INSPECTION CIRCUIT
700 FPC SUBSTRATE
800 DISPLAY AREA
900 NON-DISPLAY AREA
1001 ACTIVE MATRIX SUBSTRATE
BG BACK GATE ELECTRODE
CE COMMON ELECTRODE
PE PIXEL ELECTRODE
GL GATE BUS LINE
SL SOURCE BUS LINE

The invention claimed is:

1. An active matrix substrate that has a display area which includes multiple pixel areas and a non-display area other than the display area, the substrate comprising:
a substrate;
multiple source bus lines and multiple gate bus lines that are supported on the substrate;
multiple pixel thin-film transistors (TFTs) that are supported on the substrate and are arranged in the multiple pixel areas, respectively;
multiple inspection TFTs that are connected to at least one of the multiple source bus lines, respectively, and the multiple gate bus lines, respectively, the multiple inspection TFTs being supported on the substrate and being arranged in the non-display area;
an inspection circuit that includes the multiple inspection TFTs;
multiple terminal portions for connecting the multiple source bus lines or the multiple gate bus lines to terminals of a semiconductor chip that is mounted on the active matrix substrate; and
a first insulation layer that is positioned in the display area and the non-display area and covers the multiple pixel TFTs in the display area, wherein
at least one or more of the multiple inspection TFTs are arranged within a semiconductor chip mounting area in which the semiconductor chip is mounted,
each of the multiple inspection TFTs includes:
a semiconductor layer,
a lower gate electrode that is positioned on a side of the substrate of the semiconductor layer with a gate insulation layer in between,
an upper gate electrode that is positioned on a side opposite to the side of the substrate of the semiconductor layer with an insulation layer including the first insulation layer in between, and
a source electrode and a drain electrode that are connected to the semiconductor layer, and
the inspection circuit further includes:
a first inspection gate wiring line that is electrically connected to the lower gate electrodes of the multiple inspection TFTs, and
a second inspection gate wiring line that is electrically connected to the upper gate electrodes of the multiple inspection TFTs.

2. The active matrix substrate according to claim 1, wherein the multiple pixel TFT are bottom gate structure TFTs and are formed using an identical semiconductor film with the semiconductor layers of the multiple inspection TFTs.

3. The active matrix substrate according to claim 1, further comprising:
a second insulation layer that is positioned on the first insulation layer and includes an organic insulation layer, wherein
the second insulation layer has one or multiple opening portions that are arranged in such a manner as to overlap, at least in part, the semiconductor layer in each of the multiple inspection TFTs when viewed in a direction normal to the substrate, and
the second inspection gate wiring line is formed on the second insulation layer and within the opening portion, and a portion, positioned within the opening portion, of the second inspection gate wiring line functions as the upper gate electrode.

4. The active matrix substrate according to claim 3, wherein the one or multiple opening portions are one opening portion that is provided in such a manner as to overlap an area that includes the semiconductor layers of the multiple inspection TFTs, when viewed in the direction normal to the substrate.

5. The active matrix substrate according to claim 1, wherein
the first inspection gate wiring line includes the lower gate electrode and the second inspection gate wiring line includes the upper gate electrode, and
when viewed in a direction normal to the substrate, the multiple inspection TFTs are arranged in a first direction, and the first inspection gate wiring line and the second inspection gate wiring line extend in the first direction in such a manner as to overlap, at least in part, the semiconductor layers of the multiple inspection TFTs.

6. The active matrix substrate according to claim 1, wherein, when viewed in a direction normal to the substrate, the multiple inspection TFTs are arranged in a first direction, one of the first inspection gate wiring line and the second inspection gate wiring line extends in the first direction in such a manner as to overlap, at least in part, the semiconductor layers of the multiple inspection TFTs, and the other wiring line of the first inspection gate wiring line and the second inspection gate wiring line includes a trunk portion that extends in the first direction and multiple protrusion portions that extend from the trunk portion, in such a manner as to overlap, at least in part, the semiconductor layers of the multiple inspection TFTs.

7. The active matrix substrate according to claim 6, wherein in each of the multiple inspection TFTs, the semiconductor layer, the source electrode, and the drain electrode are arranged in such a manner that a channel is formed along a second direction that orthogonally intersects the first direction within the semiconductor layer.

8. The active matrix substrate according to claim 1, further comprising:
 a lower transparent electrode that is provided on the first insulation layer in the display area; and
 an upper transparent electrode that is positioned on the lower transparent electrode with a dielectric layer in between,
 wherein the upper gate electrodes of the multiple inspection TFTs are formed from an identical transparent conductive film with the lower transparent electrode and the upper transparent electrode.

9. The active matrix substrate according to claim 1, wherein the multiple pixel TFTs and the multiple inspection TFTs are oxide semiconductor TFTs that are made using an identical oxide semiconductor film.

10. The active matrix substrate according to claim 9, wherein the oxide semiconductor film contains an In—Ga—Zn—O-based semiconductor.

11. A display device comprising:
 the active matrix substrate according to claim 1;
 a semiconductor chip that is mounted on the semiconductor chip mounting area of the active matrix substrate;
 a counter substrate that is positioned in such a manner as to face the active matrix substrate; and
 a display medium layer that is provided between the active matrix substrate and the counter substrate.

12. An active matrix substrate that has a display area which includes multiple pixel areas and a non-display area other than the display area, the substrate comprising:
 a substrate;
 multiple source bus lines and multiple gate bus lines that are supported on the substrate;
 multiple pixel thin-film transistors (TFTs) that are supported on the substrate and are arranged in the multiple pixel areas, respectively;
 multiple inspection TFTs that are connected to at least one of the multiple source bus lines, respectively, and the multiple gate bus lines, respectively, the multiple inspection TFTs being supported on the substrate and being arranged in the non-display area;
 an inspection circuit that includes the multiple inspection TFTs;
 multiple terminal portions for connecting the multiple source bus lines or the multiple gate bus lines to terminals of a semiconductor chip that is mounted on the active matrix substrate;
 a first insulation layer that is positioned in the display area and the non-display area and covers the multiple pixel TFTs in the display area; and
 a circuit that is positioned in the non-display area and includes multiple circuit TFTs, wherein
 at least one or more of the multiple inspection TFTs are arranged within a semiconductor chip mounting area in which the semiconductor chip is mounted,
 each of the multiple inspection TFTs includes:
  a semiconductor layer,
  a lower gate electrode that is positioned on a side of the substrate of the semiconductor layer with a gate insulation layer in between,
  an upper gate electrode that is positioned on a side opposite to the side of the substrate of the semiconductor layer with an insulation layer including the first insulation layer in between,
  a source electrode and a drain electrode that are connected to the semiconductor layer,
 the multiple pixel TFTs and the multiple inspection TFTs are oxide semiconductor TFTs, and
 the multiple circuit TFTs are crystalline silicon TFTs.

13. The active matrix substrate according to claim 12, wherein the inspection circuit further includes other multiple inspection TFTs,
wherein each of the other inspection TFTs is connected in series to one of the multiple inspection TFTs, and
wherein the other inspection TFTs are crystalline silicon TFTs that are formed using an identical crystalline silicon semiconductor film with the multiple circuit TFTs.

14. The active matrix substrate according to claim 12, wherein the multiple pixel TFTs and the multiple inspection TFTs are oxide semiconductor TFTs that are formed using an identical oxide semiconductor film.

15. The active matrix substrate according to claim 14, wherein the oxide semiconductor TFTs are etch stop type TFTs.

16. The active matrix substrate according to claim 14, wherein the oxide semiconductor TFTs are channel etch type TFTs.

17. The active matrix substrate according to claim 14, wherein the oxide semiconductor film contains an In—Ga—Zn—O-based semiconductor.

18. The active matrix substrate according to claim 17, wherein the In—Ga—Zn—O-based semiconductor contains a crystalline portion.

19. The active matrix substrate according to claim 14, wherein the oxide semiconductor TFT includes an oxide semiconductor layer that has a multi-layered structure.

20. A display device comprising:
 the active matrix substrate according to claim 12;
 a semiconductor chip that is mounted on the semiconductor chip mounting area of the active matrix substrate;
 a counter substrate that is positioned in such a manner as to face the active matrix substrate; and
 a display medium layer that is provided between the active matrix substrate and the counter substrate.

* * * * *